US010456842B2

United States Patent
Tatsuoka et al.

(10) Patent No.: US 10,456,842 B2
(45) Date of Patent: Oct. 29, 2019

(54) SURFACE-COATED CUTTING TOOL IN WHICH HARD COATING LAYER EXHIBITS EXCELLENT CHIPPING RESISTANCE

(71) Applicant: MITSUBISHI MATERIALS CORPORATION, Tokyo (JP)

(72) Inventors: Sho Tatsuoka, Naka (JP); Kenichi Sato, Naka (JP); Kenji Yamaguchi, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 195 days.

(21) Appl. No.: 15/509,725

(22) PCT Filed: Sep. 18, 2015

(86) PCT No.: PCT/JP2015/076645
§ 371 (c)(1),
(2) Date: Mar. 8, 2017

(87) PCT Pub. No.: WO2016/047581
PCT Pub. Date: Mar. 31, 2016

(65) Prior Publication Data
US 2017/0297117 A1    Oct. 19, 2017

(30) Foreign Application Priority Data

Sep. 25, 2014 (JP) ................................ 2014-195795

(51) Int. Cl.
*B23B 27/14*  (2006.01)
*C23C 16/34*  (2006.01)
(Continued)

(52) U.S. Cl.
CPC ........ *B23B 27/148* (2013.01); *C23C 16/0272* (2013.01); *C23C 16/34* (2013.01);
(Continued)

(58) Field of Classification Search
USPC .......................... 428/325, 336, 697, 698, 699
See application file for complete search history.

(56) References Cited

U.S. PATENT DOCUMENTS

2010/0323176 A1   12/2010   Van Den Berg et al.
2011/0003126 A1   1/2011    Van Den Berg et al.
(Continued)

FOREIGN PATENT DOCUMENTS

EP    2823923 A    1/2015
EP    2891536 A    7/2015
(Continued)

OTHER PUBLICATIONS

Extended European Search Report dated Jun. 22, 2017 for the corresponding European Patent Application No. 15843784.8.
(Continued)

*Primary Examiner* — Archene A Turner
(74) *Attorney, Agent, or Firm* — Leason Ellis LLP

(57) ABSTRACT

A surface-coated cutting tool has a hard coating layer on a tool body. The hard coating layer includes a $(Ti_{1-x}Al_x)(C_yN_{1-y})$ layer (the average amount Xavg of Al and the average amount Yavg of C satisfy $0.60 \leq Xavg \leq 0.95$ and $0 \leq Yavg \leq 0.005$). Crystal grains having an NaCl type face-centered cubic structure in the layer have {111} orientation, a columnar structure in which the average grain width of the individual crystal grains having an NaCl type face-centered cubic structure is 0.1 μm to 2.0 μm and the average aspect ratio is 2 to 10 is included, and in the individual crystal grains having an NaCl type face-centered cubic structure, a periodic compositional variation in Ti and Al in the composition formula: $(Ti_{1-x}Al_x)(C_yN_{1-y})$ is present and the difference between the average of maximum values of x and the average of minimum values thereof is 0.03 to 0.25.

10 Claims, 4 Drawing Sheets

(51) Int. Cl.
　　　*C23C 16/36*　　　(2006.01)
　　　*C23C 16/02*　　　(2006.01)
　　　*C23C 28/04*　　　(2006.01)
　　　*C23C 28/00*　　　(2006.01)

(52) U.S. Cl.
　　　CPC ............ *C23C 16/36* (2013.01); *C23C 28/042* (2013.01); *C23C 28/044* (2013.01); *C23C 28/42* (2013.01); *B23B 2222/16* (2013.01); *B23B 2222/28* (2013.01); *B23B 2224/04* (2013.01); *B23B 2226/125* (2013.01); *B23B 2228/04* (2013.01); *B23B 2228/105* (2013.01)

(56) References Cited

U.S. PATENT DOCUMENTS

| | | | |
|---|---|---|---|
| 2014/0308083 | A1* | 10/2014 | Bjormander ............ C23C 16/36 407/119 |
| 2015/0158094 | A1 | 6/2015 | Igarashi et al. |
| 2015/0211105 | A1 | 7/2015 | Schier et al. |
| 2015/0217378 | A1 | 8/2015 | Tatsuoka et al. |
| 2017/0113285 | A1 | 4/2017 | Tatsuoka et al. |

FOREIGN PATENT DOCUMENTS

| | | |
|---|---|---|
| EP | 3127637 A | 2/2017 |
| JP | 2000-144376 A | 5/2000 |
| JP | 2010-094763 A | 4/2010 |
| JP | 2011-513594 A | 4/2011 |
| JP | 2011-516722 A | 5/2011 |
| JP | 2014-024130 A | 2/2014 |
| JP | 2014-133267 A | 7/2014 |
| JP | 2015-157351 A | 9/2015 |
| JP | 2015-163423 A | 9/2015 |
| WO | WO-2013/133441 A | 9/2013 |
| WO | WO-2014/019897 A | 2/2014 |
| WO | WO-2014/034730 A | 3/2014 |
| WO | WO-2015-147160 A | 10/2015 |

OTHER PUBLICATIONS

International Search Report dated Dec. 1, 2015 for the corresponding PCT Application No. PCT/JP2015/076645.

* cited by examiner

SURFACE-COATED CUTTING TOOL IN WHICH HARD COATING LAYER EXHIBITS EXCELLENT CHIPPING RESISTANCE

CROSS-REFERENCE TO RELATED PATENT APPLICATIONS

This application is a U.S. National Phase Application under 35 U.S.C. § 371 of International Patent Application No. PCT/JP2015/076645, filed Sep. 18, 2015, and claims the benefit of Japanese Patent Application No. 2014-195795, filed on Sep. 25, 2014, all of which are incorporated by reference in its entirety herein. The International Application was published in Japanese on Mar. 31, 2016 as International Publication No. WO/2016/047581 under PCT Article 21(2).

FIELD OF THE INVENTION

The present invention relates to a surface-coated cutting tool (hereinafter, referred to as coated tool), in which a hard coating layer exhibits excellent chipping resistance during high-speed intermittent cutting work of alloy steel or the like during which high-temperature heat is generated and an impact load is exerted on a cutting edge, and excellent cutting performance is exhibited during long-term use.

BACKGROUND OF THE INVENTION

Hitherto, in general, coated tools in which the surfaces of tool bodies made of tungsten carbide (hereinafter, referred to as WC)-based cemented carbide, titanium carbonitride (hereinafter, referred to as TiCN)-based cermet, or a cubic boron nitride (hereinafter, referred to as cBN)-based ultra-high-pressure sintered body (hereinafter, collectively referred to as a tool body) are covered with a Ti—Al-based complex nitride layer as a hard coating layer through a physical vapor deposition method are known, and it is known that these coated tools exhibit excellent wear resistance.

However, although the coated tool coated with the Ti—Al-based complex nitride layer in the related art has relatively excellent wear resistance, in a case of using the coated tool under high-speed intermittent cutting conditions, abnormal wear such as chipping easily occurs. Therefore, various suggestions for an improvement in the hard coating layer have been made.

For example, JP-A-2000-144376 discloses that a coating which is excellent in wear resistance, seizure resistance, and oxidation resistance, has a low coefficient of friction, and has good sliding characteristics is obtained by forming a complex hard coating made of at least two types of metal nitride among nitrides of Cr, Ti, Al, and V on the surface of a tool body and causing the strength ratio I(111)/I(200) between the strengths I(111) and I(200) of the X-ray diffraction peaks of a (111) plane and a (200) plane obtained through X-ray diffraction of the hard coating to be a value of 3 to 6.

For example, JP-T-2011-516722 describes that by performing chemical vapor deposition in a mixed reaction gas of $TiCl_4$, $AlCl_3$, and $NH_3$ in a temperature range of 650° C. to 900° C., a $(Ti_{1-x}Al_x)N$ layer in which the value of the amount x of Al is 0.65 to 0.95 can be deposited. However, this literature is aimed at further coating the $(Ti_{1-x}Al_2)N$ layer with an $Al_2O_3$ layer and thus improving a heat insulation effect. Therefore, the effects of the formation of the $(Ti_{1-x}Al_x)N$ layer in which the value of the amount x of Al is increased to 0.65 to 0.95 on cutting performance is not clear.

In addition, for example, JP-T-2011-513594 suggests that the heat resistance and fatigue strength of a coated tool are improved by coating a TiCN layer and an $Al_2O_3$ layer as inner layers with a $(Ti_{1-x}Al_x)N$ layer (x is 0.65 to 0.90 in terms of atomic ratio) having a cubic structure or a cubic structure including a hexagonal structure as an outer layer, and applying a compressive stress of 100 MPa to 1100 MPa to the outer layer.

Technical Problem

There has been a strong demand for power saving and energy saving during cutting work in recent years. In accordance with this, there is a trend toward a further increase in speed and efficiency during cutting work. Therefore, abnormal damage resistance such as chipping resistance, defect resistance, and peeling resistance is further required for a coated tool, and excellent wear resistance is required during long-term use.

However, in a coated tool described in JP-A-2000-144376, since the hard coating is deposited through the physical vapor deposition method, for example, it is difficult to increase the amount of Al in the hard coating. Therefore, in a case where the coated tool is provided for high-speed intermittent cutting work of alloy steel or the like, there is a problem in that it cannot be said that wear resistance and chipping resistance are sufficient.

On the other hand, in the $(Ti_{1-x}Al_x)N$ layer deposited through the chemical vapor deposition method described in JP-T-2011-516722, the amount x of Al can be increased. In addition, since a cubic structure can be formed, a hard coating layer having a predetermined hardness and excellent wear resistance is obtained. However, there are problems in that the adhesive strength thereof to a tool body is insufficient and the toughness thereof may be deteriorated.

Furthermore, in the coated tool described in JP-T-2011-513594, although the coated tool has a predetermined hardness and excellent wear resistance, the toughness thereof is deteriorated. Therefore, in a case where the coated tool is provided for high-speed intermittent cutting work of alloy steel or the like, there are problems in that abnormal damage such as chipping, defects, and peeling easily occurs and it cannot be said that satisfactory cutting performance is exhibited.

Here, a technical problem to be solved by the present invention, that is, an object of the present invention is to provide a coated tool which has excellent toughness and exhibits excellent chipping resistance and wear resistance during long-term use even in a case of being provided for high-speed intermittent cutting work of alloy steel or the like.

SUMMARY OF THE INVENTION

Solution to Problem

Therefore, from the above-described viewpoints, the inventors intensively studied to improve the chipping resistance and wear resistance of a coated tool in which a hard coating layer containing at least a layer of a complex nitride or complex carbonitride of Ti and Al (hereinafter, sometimes referred to as "(Ti,Al)(C,N)" or "$(Ti_{1-x}Al_x)(C_yN_{1-y})$") is deposited through chemical vapor deposition. As a result, the following knowledge was obtained.

That is, in the related art, in a hard coating layer which includes at least one $(Ti_{1-x}Al_x)(C_yN_{1-y})$ layer and has a predetermined average layer thickness, in a case where the $(Ti_{1-x}Al_x)(C_yN_{1-y})$ layer is formed in a columnar shape in a direction perpendicular to a tool body, the hard coating layer has high wear resistance. On the other hand, as the anisotropy of the $(Ti_{1-x}Al_x)(C_yN_{1-y})$ layer increases, the toughness of the $(Ti_{1-x}Al_x)(C_yN_{1-y})$ layer decreases. As a result, the chipping resistance and defect resistance thereof decrease, and sufficient wear resistance is not exhibited during long-term use. In addition, it cannot be said that the service life of the tool is satisfactory.

The inventors intensively studied a $(Ti_{1-x}Al_x)(C_yN_{1-y})$ layer included in a hard coating layer, and on the basis of a completely novel idea that a periodic compositional variation in Ti and Al in crystal grains having an NaCl type face-centered cubic structure in the $(Ti_{1-x}Al_x)(C_yN_{1-y})$ layer is formed, obtained novel knowledge that an increase in both hardness and toughness is achieved by introducing strain into the crystal grains having an NaCl type face-centered cubic structure, and as a result, the chipping resistance and wear resistance of the hard coating layer can be improved.

Specifically, it was found that the hard coating layer includes at least a layer of a complex nitride or complex carbonitride of Ti and Al, which is formed by a chemical vapor deposition method, in a case where the layer is expressed by the composition formula: $(Ti_{1-x}Al_x)(C_yN_{1-y})$, the average amount Xavg of Al in the total amount of Ti and Al and the average amount Yavg of C in the total amount of C and N (both Xavg and Yavg are atomic ratios) respectively satisfy $0.60 \leq Xavg \leq 0.95$ and $0 \leq Yavg \leq 0.005$, the layer of a complex nitride or complex carbonitride includes at least a phase of a complex nitride or complex carbonitride having an NaCl type face-centered cubic structure, regarding the layer, in a case where the layer is analyzed in a longitudinal sectional direction of the layer using an electron backscatter diffraction apparatus, when an inclined angle frequency distribution is obtained by measuring inclined angles of normal lines of {111} planes which are crystal planes of the crystal grains with respect to a normal direction of the surface of the tool body, dividing inclined angles in a range of 0 degrees to 45 degrees with respect to the normal direction among the measured inclined angles into intervals of 0.25 degrees, and aggregating frequencies in the respective divisions, a highest peak is present in an inclined angle division in a range of 0 degrees to 10 degrees and the sum of frequencies that are present in the range of 0 degrees to 10 degrees has a proportion of 45% or higher of the total of the frequencies in the inclined angle frequency distribution, regarding the layer of a complex nitride or complex carbonitride, in a case where the layer is observed in the longitudinal sectional direction, a columnar structure in which the average grain width W of the individual crystal grains having an NaCl type face-centered cubic structure in the layer of a complex nitride or complex carbonitride is 0.1 μm to 2.0 μm and the average aspect ratio A thereof is 2 to 10 is included, and in the individual crystal grains having an NaCl type face-centered cubic structure, a periodic compositional variation in Ti and Al in the composition formula: $(Ti_{1-x}Al_x)(C_yN_{1-y})$ is present along the normal direction of the surface of the tool body in the layer of a complex nitride or complex carbonitride and the difference Δx between the average of maximum values of x which varies periodically and the average of minimum values thereof is 0.03 to 0.25, whereby strain is introduced into the crystal grains having an NaCl type face-centered cubic structure, the hardness and toughness of the $(Ti_{1-x}Al_x)(C_yN_{1-y})$ layer are increased compared to a hard coating layer in the related art, and chipping resistance and defect resistance are correspondingly improved, and excellent wear resistance is exhibited during long-term use.

In addition, the $(Ti_{1-x}Al_x)(C_yN_{1-y})$ layer having the configuration described above can be formed by, for example, the following chemical vapor deposition method in which the composition of a reaction gas varies periodically on the surface of the tool body.

In a chemical vapor deposition reaction apparatus which is used, a gas group A of $NH_3$, $N_2$, and $H_2$ and a gas group B of $TiCl_4$, $Al(CH_3)_3$, $AlCl_3$, $N_2$, and $H_2$ are supplied into the reaction apparatus from separate gas supply tubes, the supplying of the gas group A and the gas group B into the reaction apparatus is performed so that the gases are allowed to flow at time intervals of a predetermined period only for a shorter time than the period, the supplying of the gases of the gas group A and the gas group B has a phase difference of a time shorter than the time for which the gases are supplied, and the composition of the reaction gas on the surface of the tool body can be changed over time between (a) the gas group A, (b) a mixed gas of the gas group A and the gas group B, and (c) the gas group B. Moreover, in the present invention, there is no need to introduce a long-term exhaust process intended for strict gas substitution. Therefore, as a gas supply method, for example, it is possible to realize the composition of the reaction gas on the surface of the tool body being able to be changed over time between (a) a mixed gas primarily containing the gas group A, (b) a mixed gas of the gas group A and the gas group B, and (c) a mixed gas primarily containing the gas group B by rotating gas supply ports, rotating the tool body, or reciprocating the tool body while continuously supplying the gases over time.

The $(Ti_{1-x}Al_x)(C_yN_{1-y})$ layer having a predetermined target layer thickness is formed on the surface of the tool body by performing a thermal CVD method for a predetermined time, for example, using, as the composition of the reaction gas (% by volume with respect to the total amount of the gas group A and the gas group B), the gas group A of $NH_3$: 1.0% to 2.0%, $N_2$: 0% to 5%, and $H_2$: 55% to 60% and the gas group B of $AlCl_3$: 0.6% to 0.9%, $TiCl_4$: 0.2% to 0.3%, $Al(CH_3)_3$: 0% to 0.5%, $N_2$: 0.0% to 12.0%, and $H_2$: the remainder, under a reaction atmosphere pressure of 4.5 kPa to 5.0 kPa, at a reaction atmosphere temperature of 700° C. to 900° C., and with a supply period of 1 second to 5 seconds, a gas supply time of 0.15 seconds to 0.25 seconds per one period, and a phase difference in supply between gas group A and gas group B of 0.10 seconds to 0.20 seconds.

As described above, the gas group A and the gas group B are supplied so that the times at which the gas group A and the gas group B arrive at the surface of the tool body are different from each other, a nitrogen raw material gas in the gas group A is set to $NH_3$: 1.0% to 2.0% and $N_2$: 0% to 5%, and a metal chloride raw material or a carbon raw material in the gas group B is set to $AlCl_3$: 0.6% to 0.9%, $TiCl_4$: 0.2% to 0.3%, or $Al(CH_3)_3$: 0% to 0.5%. Therefore, local compositional unevenness, dislocations, and point defects are introduced into crystal grains, and thus local strain in a crystal lattice is formed. Furthermore, the degree of {111} orientation on the side of the surface of the tool body and on the side of the surface of a coating in the crystal grains can be changed. As a result, it was found that toughness is dramatically improved while wear resistance is maintained. As a result, particularly defect resistance and chipping resistance are improved. Therefore, it was found that even in a case where the tool body is used for high-speed intermittent cutting work of alloy steel or the like during which intermittent and impact loads is exerted on a cutting edge, the hard coating layer can exhibit excellent cutting performance during long-term use.

The present invention is made based on the above-described knowledge and is characterized by including "(1) a surface-coated cutting tool in which a hard coating layer is provided on a surface of a tool body made of any of tungsten carbide-based cemented carbide, titanium carbonitride-based cermet, and a cubic boron nitride-based ultra-high-pressure sintered body, in which (a) the hard coating layer includes at least a layer of a complex nitride or complex carbonitride of Ti and Al, the layer being formed to an average layer thickness of 1 μm to 20 μm in a chemical vapor deposition method, and in a case where the layer is expressed by the composition formula: $(Ti_{1-x}Al_x)(C_yN_{1-y})$, an average amount Xavg of Al of the layer of a complex nitride or complex carbonitride in a total amount of Ti and Al and an average amount Yavg of C in a total amount of C and N (both Xavg and Yavg are atomic ratios) respectively satisfy 0.60≤Xavg≤0.95 and 0≤Yavg≤0.005, (b) the layer of a complex nitride or complex carbonitride includes at least a phase of a complex nitride or complex carbonitride having an NaCl type face-centered cubic structure, (c) regarding the layer of a complex nitride or complex carbonitride, in a case where crystal orientations of individual crystal grains having an NaCl type face-centered cubic structure in the layer of a complex nitride or complex carbonitride in a longitudinal sectional direction of the layer of a complex nitride or complex carbonitride are analyzed using an electron backscatter diffraction apparatus, when an inclined angle frequency distribution is obtained by measuring inclined angles of normal lines of {111} planes which are crystal planes of the crystal grains with respect to a normal direction of the surface of the tool body, dividing inclined angles in a range of 0 degrees to 45 degrees with respect to the normal direction among the measured inclined angles into intervals of 0.25 degrees, and aggregating frequencies in the respective divisions, a highest peak is present in an inclined angle division in a range of 0 degrees to 10 degrees, and a sum of frequencies that are present in the range of 0 degrees to 10 degrees has a proportion of 45% or higher of a total of the frequencies in the inclined angle frequency distribution, (d) regarding the layer of a complex nitride or complex carbonitride, in a case where the layer is observed in the longitudinal sectional direction, a columnar structure in which an average grain width W of the individual crystal grains having an NaCl type face-centered cubic structure in the layer of a complex nitride or complex carbonitride is 0.1 μm to 2.0 μm and an average aspect ratio A thereof is 2 to 10 is included, and (e) in the individual crystal grains having an NaCl type face-centered cubic structure in the layer of a complex nitride or complex carbonitride, a periodic compositional variation in Ti and Al in the $(Ti_{1-x}Al_x)(C_yN_{1-y})$ is present along one orientation among equivalent crystal orientations expressed by <001> of the crystal grains, and a difference Δx between an average of maximum values of x which varies periodically and an average of minimum values thereof is 0.03 to 0.25.

(2) The surface-coated cutting tool described in (1), in which, in the crystal grains having an NaCl type face-centered cubic structure in which the periodic compositional variation in Ti and Al is present in the layer of a complex nitride or complex carbonitride, the periodic compositional variation in Ti and Al is present along one orientation among the equivalent crystal orientations expressed by <001> of the crystal grains, a period along the orientation is 3 nm to 100 nm, and a compositional variation XO of Al in a plane perpendicular to the orientation in a total amount of Ti and Al is 0.01 or less.

(3) The surface-coated cutting tool described in (1) or (2), in which, regarding the layer of a complex nitride or complex carbonitride, lattice constants a of the crystal grains having an NaCl type face-centered cubic structure are obtained from X-ray diffraction, and the lattice constants a of the crystal grains having an NaCl type face-centered cubic structure satisfy a relationship of $0.05a_{TiN}+0.95a_{AlN} \le a \le 0.4a_{TiN}+0.6a_{AlN}$ for a lattice constant $a_{TiN}$ of cubic TiN and a lattice constant $a_{AlN}$ of cubic AlN.

(4) The surface-coated cutting tool described in any one of (1) to (3), in which the layer of a complex nitride or complex carbonitride is formed of a single phase of a complex nitride or complex carbonitride of Ti and Al having an NaCl type face-centered cubic structure.

(5) The surface-coated cutting tool described in any one of (1) to (3), in which, regarding the layer of a complex nitride or complex carbonitride, in a case where the layer is observed in the longitudinal sectional direction, in crystal grain boundaries of the columnar structure constituted by the individual crystal grains having an NaCl type face-centered cubic structure in the layer of a complex nitride or complex carbonitride, fine crystal grains having a hexagonal structure are present, an area proportion of the fine crystal grains present is 30% or lower by area, and an average grain size R of the fine crystal grains is 0.01 μm to 0.3 μm.

(6) The surface-coated cutting tool described in any one of (1) to (5), in which, between the tool body and the layer of a complex nitride or complex carbonitride of Ti and Al, a lower layer which is formed of a Ti compound layer that includes one layer or two or more layers of a Ti carbide layer, a Ti nitride layer, a Ti carbonitride layer, a Ti oxycarbide layer, and a Ti oxycarbonitride layer and has an average total layer thickness of 0.1 μm to 20 μm is present.

(7) The surface-coated cutting tool described in any one of (1) to (6), in which an upper layer which includes an aluminum oxide layer having an average layer thickness of at least 1 μm to 25 μm is present in an upper portion of the layer of a complex nitride or complex carbonitride.

(8) The surface-coated cutting tool described in any one of (1) to (7), in which the layer of a complex nitride or complex carbonitride is formed by a chemical vapor deposition method in which at least trimethylaluminum is contained as a reaction gas component."

The present invention will be described below in detail.

Average Layer Thickness of Layer of Complex Nitride or Complex Carbonitride Included in Hard Coating Layer The hard coating layer of the present invention includes at least the layer of a complex nitride or complex carbonitride of Ti and Al, which is formed through chemical vapor deposition and is expressed by the composition formula: $(Ti_{1-x}Al_x)(C_yN_{1-y})$. The layer of a complex nitride or complex carbonitride has high hardness and excellent wear resistance, and the effect thereof is significantly exhibited particularly when the average layer thickness thereof is 1 μm to 20 μm. The reason for this is that when the average layer thickness thereof is smaller than 1 μm, the layer thickness thereof is too small to sufficiently ensure wear resistance during long-term use, and when the average layer thickness thereof is greater than 20 μm, the crystal grains of the layer of a complex nitride or complex carbonitride of Ti and Al are likely to coarsen and chipping easily occurs. Therefore, the average layer thickness thereof was selected to be 1 μm to 20 μm.

In addition, the layer of a complex nitride or complex carbonitride may have a mixed phase of cubic and hexagonal phases. However, when the area proportion of the crystal grains having an NaCl type face-centered cubic structure is lower than 70% by area, a reduction in hardness occurs. Therefore, it is preferable that the area proportion of the crystal grains having an NaCl type face-centered cubic structure is 70% or higher by area and it is more preferable that the layer has a single phase of a complex nitride or complex carbonitride of Ti and Al with the NaCl type face-centered cubic structure.

Composition of Layer of Complex Nitride or Complex Carbonitride Included in Hard Coating Layer:

The layer of a complex nitride or complex carbonitride included in the hard coating layer of the present invention is controlled such that that the average amount Xavg of Al in the total amount of Ti and Al and the average amount Yavg of C in the total amount of C and N (both Xavg and Yavg are atomic ratios) respectively satisfy $0.60 \leq Xavg \leq 0.95$ and $0 \leq Yavg \leq 0.005$.

The reason for this is that when the average amount Xavg of Al is less than 0.60, the hardness of the layer of a complex nitride or complex carbonitride of Ti and Al deteriorates. Therefore, in a case where the layer is provided for high-speed intermittent cutting work of alloy steel or the like, the wear resistance thereof is insufficient. On the other hand, when the average amount Xavg of Al is more than 0.95, the amount of Ti is relatively reduced, resulting in embrittlement and a reduction in chipping resistance. Therefore, the average amount Xavg of Al was selected to be $0.60 \leq Xavg \leq 0.95$.

When the average amount Yavg of the component C contained in the layer of a complex nitride or complex carbonitride is a small amount in a range of $0 \leq Yavg \leq 0.005$, the adhesion between the layer of a complex nitride or complex carbonitride and the tool body or the lower layer is improved. In addition, the lubricity thereof is improved and thus an impact during cutting is relieved, resulting in an improvement in the defect resistance and chipping resistance of the layer of a complex nitride or complex carbonitride. On the other hand, when the average amount Yavg of the component C is outside of the range of $0 \leq Yavg \leq 0.005$, the toughness of the layer of a complex nitride or complex carbonitride decreases and the defect resistance and chipping resistance in contrast, decrease, which is not preferable. Therefore, the average amount Yavg of C was selected to be $0 \leq Yavg \leq 0.005$.

Inclined Angle Frequency Distribution for {111} Planes Which Are Crystal Planes of Individual Crystal Grains having NaCl Type Face-Centered Cubic Structure in Layer of Complex Nitride or Complex Carbonitride of Ti and Al $((Ti_{1-x}Al_x)(C_yN_{1-y})$ Layer):

Regarding the $(Ti_{1-x}Al_x)(C_yN_{1-y})$ layer of the present invention, in a case where the crystal orientations of individual crystal grains having an NaCl type face-centered cubic structure are analyzed in the longitudinal sectional direction thereof using an electron backscatter diffraction apparatus, the inclined angles of normal lines of {111} planes which are the crystal planes of the crystal grains with respect to the normal line of the surface of the tool body (a direction perpendicular to the surface of the tool body in a section polished surface) are measured. When inclined angles in a range of 0 degrees to 45 degrees with respect to the normal direction among the measured inclined angles are divided into intervals of 0.25 degrees and frequencies in the respective divisions are aggregated, in a case where a form of an inclined angle frequency distribution is shown in which a highest peak is present in an inclined angle division in a range of 0 degrees to 10 degrees and the sum of frequencies that are present in the range of 0 degrees to 10 degrees has a proportion of 45% or higher of the total of the frequencies in the inclined angle frequency distribution, the hard coating layer including the layer of a complex nitride or complex carbonitride of Ti and Al has high hardness while maintaining the NaCl type face-centered cubic structure. Furthermore, with the form of the inclined angle frequency distribution as described above, the adhesion between the hard coating layer and the body is dramatically improved.

Therefore, even in a case where the coated tool is used, for example, for high-speed intermittent cutting of stainless steel or the like, the occurrence of chipping, defects, peeling, and the like is suppressed, and excellent wear resistance is exhibited.

Average Grain Width W and Average Aspect Ratio A of Crystal Grains Having NaCl Type Face-Centered Cubic Structure Included in Layer of Complex Nitride or Complex Carbonitride Regarding the crystal grains having an NaCl type face-centered cubic structure in the layer of a complex nitride or complex carbonitride, in a case where the grain width thereof in a direction parallel to the surface of the tool body is referred to as w, and the grain length thereof in the direction perpendicular to the surface of the tool body is referred to as l, the ratio l/w between w and l is referred to as the aspect ratio a of each crystal grain, the average value of the aspect ratios a obtained for the individual crystal grains is further referred to as an average aspect ratio A, and the average value of the grain widths w obtained for the individual crystal grains is referred to as an average grain width W, in the present invention, the average grain width W and the average aspect ratio A are controlled to be 0.1 μm to 2.0 μm and 2 to 10, respectively.

When this condition is satisfied, the crystal grains having an NaCl type face-centered cubic structure included in the layer of a complex nitride or complex carbonitride have a columnar structure and exhibit excellent wear resistance. On the other hand, when the average aspect ratio A is lower than 2, a periodic compositional distribution, which is a feature of the present invention, is less likely to be formed in the crystal grains having an NaCl type face-centered cubic structure. When the average aspect ratio A is higher than 10, it is difficult to suppress the propagation of cracks. In addition, when the average grain width W is smaller than 0.1 μm, wear resistance decreases. When the average grain width W is greater than 2.0 μm, toughness decreases. Therefore, the average grain width W of the crystal grains having an NaCl type face-centered cubic structure included in the layer of a complex nitride or complex carbonitride was selected to be 0.1 μm to 2.0 μm.

Compositional Variation in Ti and Al Present in Crystal Grains Having NaCl Type Face-Centered Cubic Structure Furthermore, in a case where crystals having an NaCl type face-centered cubic structure are expressed by the composition formula: $(Ti_{1-x}Al_x)(C_yN_{1-y})$, when a periodic compositional variation in Ti and Al is present in crystal grains, strain occurs in the crystal grains, resulting in an improvement in hardness. However, when the difference Δx between the average of maximum values of x and the average of minimum values thereof in the composition formula, which is an index of the degree of the compositional variation in Ti and Al, is smaller than 0.03, the degree of strain in the crystal grains described above is low, and a sufficient improvement in hardness cannot be expected. On the other hand, when the difference Δx between the average of the maximum values of x and the average of the minimum values thereof is greater than 0.25, the degree of strain in the crystal grains becomes too high, there are more lattice defects, and hardness decreases. Here, regarding the compositional variation in Ti and Al present in the crystal grains having an NaCl type face-centered cubic structure, the difference Δx between the average of the maximum values of x which varies periodically and the average of the minimum values thereof selected to be 0.05 to 0.25.

In addition, it is preferable that a periodic compositional variation in Ti and Al is present along one orientation among equivalent crystal orientations expressed by <001> of the crystal grains having an NaCl type face-centered cubic structure. However, when the period thereof is smaller than 3 nm, toughness decreases. On the other hand, when the period is greater than 100 nm, the effect of improving hardness cannot be expected. Therefore, it is preferable that the period that is present along one orientation among equivalent crystal orientations expressed by <001> of cubic crystal grains is nm to 100 nm. In addition, when a compositional variation XO of Al in the total amount of Ti and Al in a plane orthogonal to the orientation is 0.01 or lower, dislocation slip in a {001} plane at an angle with respect to the {111} plane is induced, resulting in an improvement in toughness.

Lattice Constants a of Crystal Grains Having NaCl Type Face-Centered Cubic Structure Included in Layer of Complex Nitride or Complex Carbonitride An X-ray diffraction test was performed on the layer of a complex nitride or complex carbonitride using an X-ray diffraction apparatus and Cu—Kα radiation as a radiation source and the lattice constants a of the crystal grains having an NaCl type face-centered cubic structure were obtained. When the lattice constants a of the crystal grains satisfy a relationship of $0.05a_{TiN}+0.95a_{AlN} \leq a \leq 0.4a_{TiN}+0.6a_{AlN}$ for the lattice constant $a_{TiN}$: 4.24173 Å of cubic TiN (JCPDS 00-038-1420) and the lattice constant $a_{AlN}$: 4.045 Å of cubic AlN (JCPDS 00-046-1200), higher hardness is exhibited, and high thermal conductivity is exhibited. Therefore, in addition to excellent wear resistance, excellent thermal shock resistance is provided.

Fine Crystal Grains Present in Grain Boundaries of Columnar Structure Constituted by Individual Crystal Grains Having NaCl Type Face-Centered Cubic Structure in Layer of Complex Nitride or Complex Carbonitride, and Area Proportion and Average Grain Size R of Fine Grains:

Since fine crystal grains having a hexagonal structure are present in grain boundaries of a columnar structure constituted by the individual crystal grains having an NaCl type face-centered cubic structure, grain boundary sliding is suppressed, resulting in an improvement in toughness. However, when the area proportion thereof is higher than 30% by area, the proportion of crystal phases having an NaCl type face-centered cubic structure is relatively decreased and thus hardness decreases, which is not preferable. In addition, when the average grain size R of the fine crystal grains is smaller than 0.01 μm, an effect of suppressing grain boundary sliding is insufficient. When the average grain size R thereof is greater than 0.3 μm, strain in the columnar structure increases and thus hardness decreases, which is not preferable.

Lower Layer and Upper Layer

The layer of a complex nitride or complex carbonitride of the present invention exhibits sufficient effects in itself. However, in a case where the lower layer which is formed of a Ti compound layer that includes one layer or two or more layers of a Ti carbide layer, a Ti nitride layer, a Ti carbonitride layer, a Ti oxycarbide layer, and a Ti oxycarbonitride layer and has an average total layer thickness of 0.1 μm to 20 μm is provided, and/or in a case where the upper layer which includes an aluminum oxide layer having an average layer thickness of 1 μm to 25 μm is provided, together with the effects of these layers, better characteristics can be created. In a case where the lower layer which is formed of a Ti compound layer that includes one layer or two or more layers of a Ti carbide layer, a Ti nitride layer, a Ti carbonitride layer, a Ti oxycarbide layer, and a Ti oxycarbonitride layer is provided, when the average total layer thickness of the lower layer is smaller than 0.1 μm, the effect of the lower layer is insufficiently exhibited. On the other hand, when the average total layer thickness thereof is greater than 20 μm, the crystal grains easily coarsen and chipping easily occurs. In addition, when the average total layer thickness of the upper layer including an aluminum oxide layer is smaller than 1 μm, the effect of the lower layer is insufficiently exhibited. On the other hand, when the average total layer thickness thereof is greater than 25 μm, the crystal grains easily coarsen and chipping easily occurs.

Advantageous Effects of Invention

In the present invention, the surface-coated cutting tool provided with the hard coating layer on the surface of the tool body has a configuration unique to the present invention in which the hard coating layer includes at least the layer of a complex nitride or complex carbonitride of Ti and Al, which is formed by a chemical vapor deposition method and has an average layer thickness of 1 μm to 20 μm, in a case where the layer is expressed by the composition formula: $(Ti_{1-x}Al_x)(C_yN_{1-y})$, the average amount Xavg of Al in the total amount of Ti and Al and the average amount Yavg of C in the total amount of C and N (both Xavg and Yavg are atomic ratios) respectively satisfy $0.60 \leq Xavg \leq 0.95$ and $0 \leq Yavg \leq 0.005$, crystal grains having an NaCl type face-centered cubic structure are present among crystal grains constituting the layer of a complex nitride or complex carbonitride, in a case where the crystal orientations of the crystal grains are analyzed in the longitudinal sectional direction thereof using an electron backscatter diffraction apparatus, when an inclined angle frequency distribution is obtained by measuring the inclined angles of normal lines of {111} planes which are the crystal planes of the crystal grains with respect to the normal direction of the surface of the tool body, dividing inclined angles in a range of 0 degrees to 45 degrees with respect to the normal direction among the measured inclined angles into intervals of 0.25 degrees, and aggregating frequencies in the respective divisions, a highest peak is present in an inclined angle division in a range of 0 degrees to 10 degrees and the sum of frequencies that are present in the range of 0 degrees to 10 degrees has a proportion of 45% or higher of the total of the frequencies in the inclined angle frequency distribution, regarding the layer of a complex nitride or complex carbonitride, in a case where the layer is observed in the longitudinal sectional direction, a columnar structure in which the average grain width W of the individual crystal grains having an NaCl type face-centered cubic structure in the layer of a complex nitride or complex carbonitride is 0.1 μm to 2.0 μm and the average aspect ratio A thereof is 2 to 10 is included, and in the crystal grains having an NaCl type face-centered cubic structure, a periodic compositional variation in Ti and Al in the composition formula: $(Ti_{1-x}Al_x)(C_yN_{1-y})$ is present along the layer thickness direction of the layer of a complex nitride or complex carbonitride, and the difference $\Delta x$ between the average of maximum values of x which varies periodically and the average of minimum values thereof is 0.03 to 0.25, whereby strain is introduced into the crystal grains having a cubic structure. Therefore, the hardness of the grains is improved, and the toughness thereof is improved while high wear resistance is maintained. As a result, the effect of improving chipping resistance is exhibited, excellent cutting performance is exhibited during long-term use compared to a hard coating layer in the related art, and thus an increase in the service life of the coated tool is achieved.

Particularly, in the crystal grains having an NaCl type face-centered cubic structure in the layer of a complex nitride or complex carbonitride of Ti and Al, a periodic compositional variation in Ti and Al is present in the crystal grains, and thus strain is introduced into crystal grains, resulting in improvement in hardness. In addition, since the columnar structure is included, high wear resistance is exhibited. At the same time, since the fine crystal grains having a hexagonal structure are present in the crystal grain boundaries of the columnar structure, grain boundary sliding is insufficient, resulting in an improvement in toughness. Furthermore, since the crystal grains having an NaCl type face-centered cubic structure are aligned with {111} planes, both flank wear resistance and crater wear resistance are improved. Moreover, the coated tool of the present invention exhibits excellent wear resistance as well as chipping resistance and defect resistance even in a case of being used for high-speed intermittent cutting work of alloy steel or the like during which intermittent and impact loads are exerted on a cutting edge.

BRIEF DESCRIPTION OF THE DRAWINGS

These and other features and advantages of the present invention will become more readily appreciated when considered in connection with the following detailed description and appended drawings, wherein like designations denote like elements in the various views, and wherein.

DETAILED DESCRIPTION OF THE INVENTION

Figure 1:
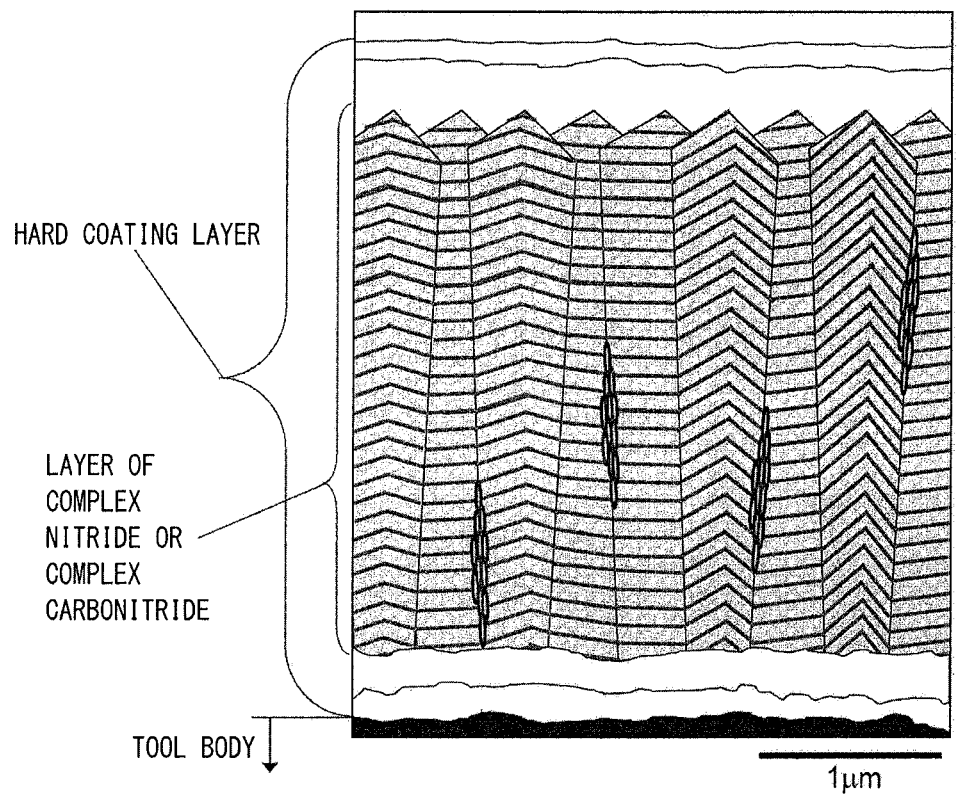
FIG. 1 is a film configuration schematic view schematically illustrating the section of a layer of a complex nitride or complex carbonitride of Ti and Al included in a hard coating layer of the present invention.
Figure 2:
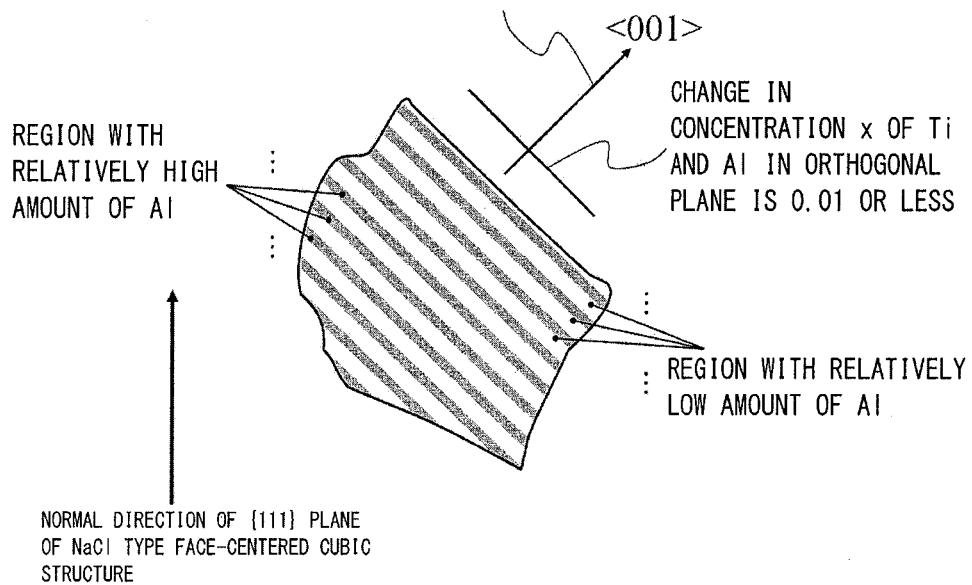
FIG. 2 is a schematic view schematically illustrating that, in crystal grains having an NaCl type face-centered cubic structure in which a periodic compositional variation in Ti and Al is present in the section of a layer of a complex nitride or complex carbonitride of Ti and Al included in a hard coating layer corresponding to an embodiment of the present invention, the periodic compositional variation in Ti and Al is present along one orientation among equivalent crystal orientations expressed by <001> of the crystal grains, and the periodic compositional variation in Ti and Al in a plane orthogonal to the orientation is small.
Figure 3:
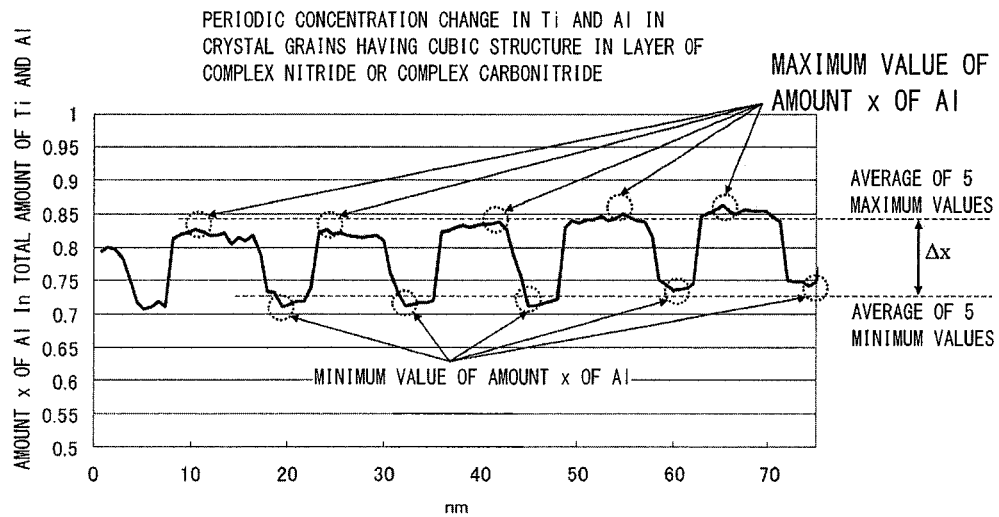
FIG. 3 shows an example of a graph of a periodic compositional variation x in Ti and Al as a result of line analysis performed by energy-dispersive X-ray spectroscopy (EDS) using a transmission electron microscope on the crystal grains having an NaCl type face-centered cubic structure in which the periodic compositional variation in Ti and Al is present in the section of the layer of a complex nitride or complex carbonitride of Ti and Al included in the hard coating layer corresponding to the embodiment of the present invention.

Next, Examples of the coated tool of the present invention will be described in more detail.

Example 1

As raw material powders, a WC powder, a TiC powder, a TaC powder, an NbC powder, a $Cr_3C_2$ powder, and a Co powder, all of which had an average grain size of 1 μm to 3 μm, were prepared, and the raw material powders were mixed in mixing compositions shown in Table 1. Wax was further added thereto, and the mixture was blended in acetone by a ball mill for 24 hours and was decompressed and dried. Thereafter, the resultant was press-formed into compacts having predetermined shapes at a pressure of 98 MPa, and the compacts were sintered in a vacuum at 5 Pa under the condition that the compacts were held at a predetermined temperature in a range of 1370° C. to 1470° C. for one hour. After the sintering, tool bodies A to C made of WC-based cemented carbide with insert shapes according to ISO standard SEEN1203AFSN were produced.

In addition, as raw material powders, a TiCN (TiC/TiN=50/50 in terms of mass ratio) powder, an $Mo_2C$ powder, a ZrC powder, an NbC powder, a WC powder, a Co powder, and an Ni powder, all of which had an average grain size of 0.5 μm to 2 μm, were prepared, and the raw material powders were mixed in mixing compositions shown in Table 2, were subjected to wet mixing by a ball mill for 24 hours, and were dried. Thereafter, the resultant was press-formed into compacts at a pressure of 98 MPa, and the compacts were sintered in a nitrogen atmosphere at 1.3 kPa under the condition that the compacts were held at a temperature of 1500° C. for one hour. After the sintering, a tool body D made of TiCN-based cermet with insert shapes according to ISO standard SEEN1203AFSN was produced.

Next, present invention coated tools 1 to 9 were produced by forming hard coating layers, which included a $(Ti_{1-x}Al_x)(C_yN_{1-y})$ layer in which crystal grains having an NaCl type face-centered cubic structure with a periodic compositional variation in Ti and Al shown in Table 7 were present in an area proportion shown in Table 7 and which had a target layer thickness shown in Table 7, on the surfaces of the tool bodies A to D through a thermal CVD method for a predetermined time using a chemical vapor deposition apparatus under forming conditions A to I shown in Table 4 in which a gas group A of $NH_3$, $N_2$ and $H_2$ and a gas group B of $TiCl_4$, $Al(CH_3)_3$, $AlCl_3$, $N_2$, and $H_2$ were used and in each gas supply method, a reaction gas composition (% by volume with respect to the total amount of the gas group A and the gas group B) included a gas group A of $NH_3$: 1.0% to 1.5%, $N_2$: 0.0% to 5.0%, $H_2$: 55% to 60% and a gas group B of $AlCl_3$: 0.6% to 0.9%, $TiCl_4$: 0.2% to 0.3%, $Al(CH_3)_3$: 0% to 0.5%, $N_2$: 0.0% to 12.0%, $H_2$: the remainder, a reaction atmosphere pressure was 4.5 kPa to 5.0 kPa, a reaction atmosphere temperature was 700° C. to 900° C., a supply period was 1 second to 5 seconds, a gas supply time per one period was 0.15 seconds to 0.25 seconds, and a phase difference in supply between gas group A and gas group B was 0.10 seconds to 0.20 seconds.

In addition, any of a lower layer and an upper layer shown in Table 6 was formed on the present invention coated tools 3 to 9 under forming conditions shown in Table 3.

Regarding a layer of a complex nitride or complex carbonitride of Ti and Al included in the hard coating layers of the present invention coated tools 1 to 9, a plurality of visual fields were observed using a scanning electron microscope (at a magnification of 5000× and 20,000×). As illustrated in a film configuration schematic view in FIG. 1, it was confirmed that fine crystal grains having a hexagonal structure were present in crystal grain boundaries of a columnar structure constituted by the crystal grains having an NaCl type face-centered cubic structure, the area proportion thereof was 30% or less by area, and the average grain size R of the fine crystal grains was 0.01 μm to 0.3 μm. The average grain size R of the fine crystal grains could be obtained by searching a plurality of observation visual fields for three portions having a grain boundary length of 0.5 μm or greater among the grain boundaries of the columnar structure where the fine crystal grains were found, counting the number of grain boundaries that were present on a line segment 0.5 μm in each of the portions, and dividing 1.5 μm by the sum of the numbers of grain boundaries in the three portions.

In addition, it was confirmed through line analysis by energy-dispersive X-ray spectroscopy (EDS) using a transmission electron microscope (at a magnification of 200,000×) that a periodic compositional variation of Ti and Al was present in the crystal grains having an NaCl type face-centered cubic structure. As a result of more detailed analysis, it was confirmed that the difference between the average of the maximum values and the average of the minimum values x which is a periodic compositional variation in Ti and Al was 0.03 to 0.25.

In addition, for the purpose of comparison, like the present invention coated tools 1 to 9, hard coating layers including at least a layer of a complex nitride or complex carbonitride of Ti and Al were deposited on the surfaces of the tool bodies A to D to have a target layer thickness (μm) shown in Table 8 under the conditions shown in Tables 3 and 5. At this time, comparative coated tools 1 to 9 were produced by forming the hard coating layers so that the position of the reaction gas on the surface of the tool body was not changed over time during a process of forming a $(Ti_{1-x}Al_x)(C_yN_{1-y})$ layer.

In addition, like the present invention coated tools 3 to 9, any of a lower layer and an upper layer shown in Table 6 was formed on the comparative coated tools 3 to 9 under the forming conditions shown in Table 3.

For reference, a reference coated tool 10 shown in Table 8 was produced by depositing $(Ti_{1-x}Al_x)(C_yN_{1-y})$ layers of a reference example on the surfaces of the tool body B to have target layer thicknesses through arc ion plating using a physical vapor deposition apparatus in the related art.

In addition, conditions of the arc ion plating using the deposition of the reference example are as follows.

(a) The tool body B was subjected to ultrasonic cleaning in acetone and was dried. In this state, the tool body B was mounted along outer circumferential portions on a rotating table in an arc ion plating apparatus at positions distant from the center axis thereof by predetermined distances in a radial direction thereof, and an Al—Ti alloy having a predetermined composition was disposed as a cathode electrode (evaporation source).

(b) First, while the inside of the apparatus was evacuated and maintained in a vacuum at $10^{-2}$ Pa or lower, the inside of the apparatus was heated to 500° C. by a heater, and a DC bias voltage of −1000 V was thereafter applied to the tool body that was rotated while being revolved on the rotating table. In addition, arc discharge was generated by allowing a current of 200 A to flow between the cathode electrode made of the Al—Ti alloy and an anode electrode such that Al and Ti ions were generated in the apparatus and the surface of the tool body was subjected to bombard cleaning.

(c) Next, nitrogen gas as a reaction gas was introduced into the apparatus to form a reaction atmosphere at 4 Pa, and a DC bias voltage of −50 V was applied to the tool body that was rotated while being revolved on the rotating table. In addition, arc discharge was generated by allowing a current of 120 A to flow between the cathode electrode (evaporation source) made of the Al—Ti alloy and the anode electrode such that a (Ti,Al)N layer having a target composition and a target layer thickness shown in Table 8 was deposited on the surface of the tool body, thereby producing the reference coated tool 10.

The section of each of constituent layers of the present invention coated tools 1 to 9, the comparative coated tools 1 to 9, and the reference coated tool 10 was measured using a scanning electron microscope (at a magnification of 5000×). An average layer thickness was obtained by measuring and averaging the layer thicknesses of five points in an observation visual field. All of the results showed substantially the same average layer thicknesses as the target layer thicknesses shown in Tables 6 to 8.

In addition, regarding the average amount Xavg of Al of the layer of a complex nitride or complex carbonitride, a sample of which the surface was polished using an electron probe micro-analyzer (EPMA) was irradiated with electron beams from the sample surface side, and the average amount Xavg of Al was obtained by averaging 10 points of the analytic result of obtained characteristic X-rays. The average amount Yavg of C was obtained by secondary ion mass spectrometry (SIMS). Ion beams were emitted toward a range of 70 μm×70 μm from the sample surface side, and the concentration of components emitted by a sputtering action was measured in a depth direction. The average amount Yavg of C represents the average value in the depth direction of the layer of a complex nitride or complex carbonitride of Ti and Al. However, the amount of C excludes an unavoidable amount of C which is included even though gas containing C is not intentionally used as a gas raw material. Specifically, the amount (atomic ratio) of the component C contained in the layer of a complex nitride or complex carbonitride in a case where the amount of supplied $Al(CH_3)_3$ was set to 0 was obtained as the unavoidable amount of C, and a value obtained by subtracting the unavoidable amount of C from the amount (atomic ratio) of the component C contained in the layer of a complex nitride or complex carbonitride obtained in a case where Al(CH$_3$)$_3$ was intentionally supplied was selected to be Yavg.

In addition, regarding the present invention coated tools 1 to 9, the comparative coated tools 1 to 9, and the reference coated tool 10, in the individual crystal grains which were present in a range at a length of 10 μm in a direction parallel to the surface of the tool body in less than the film thickness of the layer of a complex nitride or complex carbonitride in a normal direction thereof and had an NaCl type face-centered cubic structure in the (Ti$_{1-x}$Al$_x$)(C$_y$N$_{1-y}$) layer included in the layer of a complex nitride or complex carbonitride, grain widths w in the direction parallel to the surface of the body and grain lengths l in the direction perpendicular to the surface of the body were measured from a sectional direction in the direction perpendicular to the tool body using a scanning electron microscope (at a magnification of 5000× and 20,000×), the aspect ratio a(=l/w) of each of the crystal grains was calculated, the average value of the aspect ratios a obtained for the individual crystal grains was calculated as an average aspect ratio A, and the average value of the grain widths w obtained for the individual crystal grains was calculated as an average grain width W. Furthermore, the average grain size R of fine crystal grains that were present in the grain boundaries of a columnar structure constituted by the individual crystal grains having a cubic structure was also calculated. The results are shown in Tables 7 and 8.

In addition, regarding an inclination angle frequency distribution of the hard coating layer, in a state where the section of the hard coating layer including the layer of a complex nitride or complex carbonitride of Ti and Al in the direction perpendicular to the surface of the tool body was polished as a polished surface, the polished surface was set in the body tube of a field emission scanning electron microscope, and an electron beam was emitted toward each of the crystal grains having a cubic crystal lattice, which were present in a measurement range of the section polished surface at an incident angle of 70 degrees with respect to the section polished surface at an acceleration voltage of 15 kV and an emission current of 1 nA. Regarding the hard coating layer in a measurement range at a length of 100 μm in the direction parallel to the surface of the tool body in less than the film thickness along the section in the direction perpendicular to the surface of the tool body, inclined angles of normal lines of {111} planes which were crystal planes of the crystal grains with respect to the normal line (the direction perpendicular to the surface of the body in the section polished surface) of the surface of the body were measured using an electron backscatter diffraction imaging device at an interval of 0.01 μm/step. On the basis of the measurement results, measured inclined angles in a range of 0 degrees to 45 degrees among the measured inclined angles were divided into intervals of 0.25 degrees, frequencies in the respective divisions were aggregated, and the presence of the peaks of the frequencies present in a range of 0 degrees to 10 degrees was checked. In addition, the proportion of the frequencies present in the range of 0 degrees to 10 degrees was obtained. The results are also shown in Tables 7 and 8.

Figure 4:
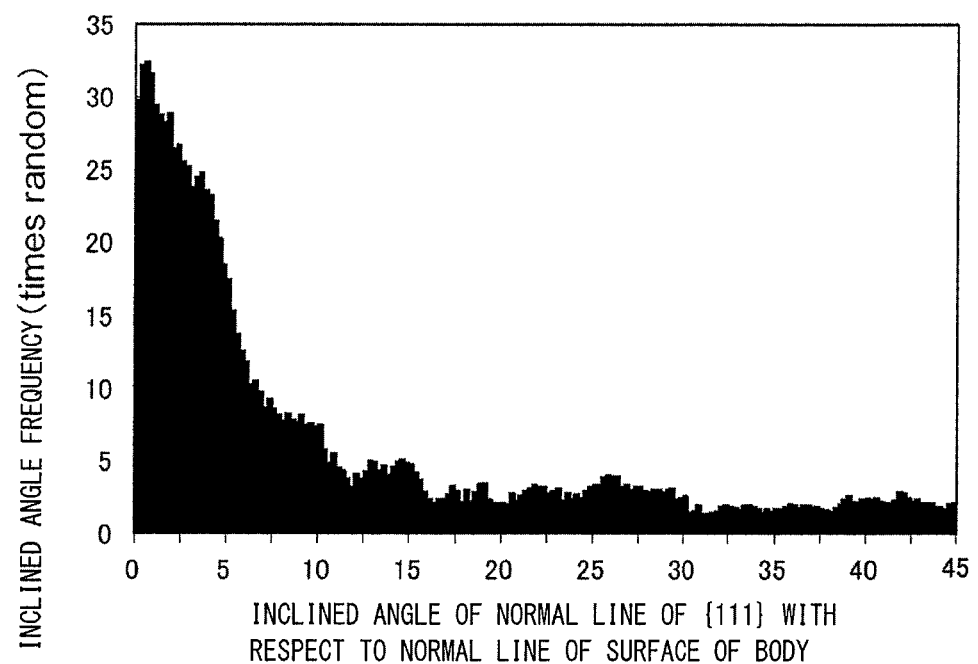
FIG. 4 shows an example of an inclined angle frequency distribution which is obtained by measuring inclined angles of normal lines of {111} planes which are crystal planes of the crystal grains with respect to a normal direction of the surface of a tool body in the section of a layer of a complex nitride or complex carbonitride of Ti and Al included in a hard coating layer of a present invention coated tool, dividing inclined angles in a range of 0 degrees to 45 degrees with respect to the normal direction among the measured inclined angles into intervals of 0.25 degrees, and aggregating frequencies in the respective divisions.
Figure 5:
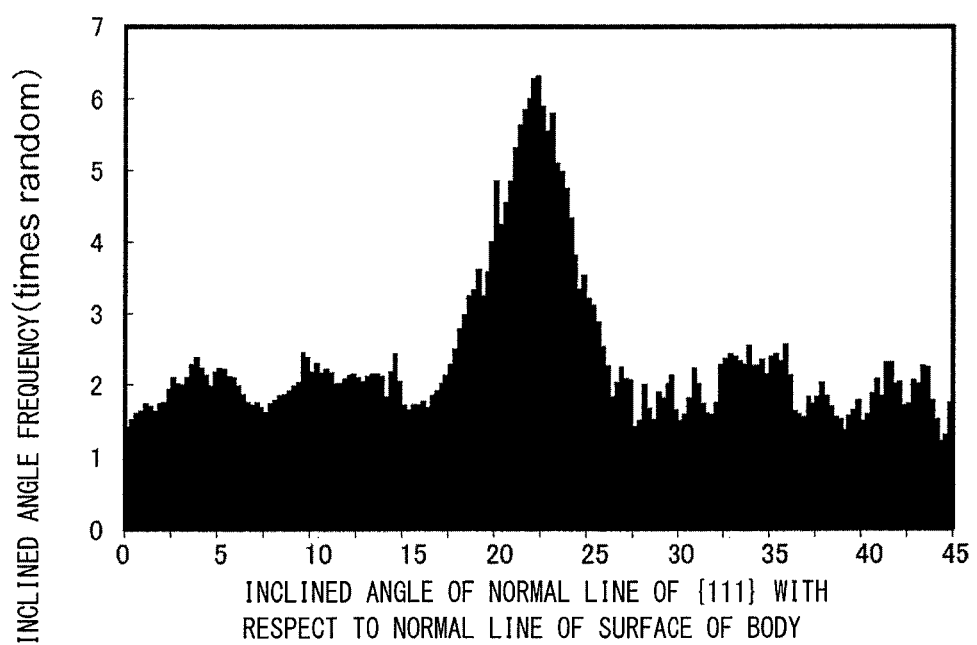
FIG. 5 shows an example of an inclined angle frequency distribution which is obtained by measuring inclined angles of normal lines of {111} planes which are crystal planes of the crystal grains with respect to a normal direction of the surface of a tool body in the section of a layer of a complex nitride or complex carbonitride of Ti and Al included in a hard coating layer of an inclined angle frequency distribution, dividing inclined angles in a range of 0 degrees to 45 degrees with respect to the normal direction among the measured inclined angles into intervals of 0.25 degrees, and aggregating frequencies in the respective divisions.

As an example, FIG. 4 shows an inclined angle frequency distribution measured for the present invention coated tools, and FIG. 5 shows an inclined angle frequency distribution graph measured for the comparative coated tools.

In addition, in a state where the section of the hard coating layer including the layer of a complex nitride or complex carbonitride of Ti and Al in the direction perpendicular to the surface of the tool body was polished as a polished surface, the polished surface was set in the body tube of the field emission scanning electron microscope, and an electron beam was emitted toward each of the crystal grains which were present in the measurement range of the section polished surface at an incident angle of 70 degrees with respect to the section polished surface at an acceleration voltage of 15 kV and an emission current of 1 nA. Regarding the hard coating layer in a range at a length of 50 μm in the direction parallel to the tool body in less than the layer thickness of the layer of a complex nitride or complex carbonitride in the normal direction thereof, an electron backscatter diffraction image was measured using an electron backscatter diffraction apparatus device at an interval of 0.01 μm/step. By analyzing the crystal structure of the individual crystal grains, fine crystal grains that were present in the grain boundaries of a columnar structure constituted by the crystal grains having an NaCl type face-centered cubic structure were identified as a hexagonal structure, and the area proportion of the fine crystal grains was obtained. The results are also shown in Tables 7 and 8.

Furthermore, a small region of the layer of a complex nitride or complex carbonitride was observed by using the transmission electron microscope (at a magnification of 200,000×), and line analysis from the section side was performed using energy-dispersive X-ray spectroscopy (EDS). It was confirmed that a periodic compositional variation in Ti and Al was present in the composition formula: (Ti$_{1-x}$Al$_x$)(C$_y$N$_{1-y}$) in the crystal grains having an NaCl type face-centered cubic structure. In addition, through electron diffraction of the crystal grains, it was confirmed that the periodic compositional variation in Ti and Al was present along one orientation among equivalent crystal orientations expressed by <001> of the crystal grains having an NaCl type face-centered cubic structure. Line analysis through EDS along the orientation was performed, the difference between the average of maximum values of the periodic compositional variation in Ti and Al and the average of minimum values thereof was obtained as Δx, and furthermore, the period of the maximum values was obtained as the period of the periodic compositional variation in Ti and Al. Line analysis along a direction orthogonal to the orientation was performed, and the difference between the maximum value and the minimum value of the amount x of Al in the total amount of Ti and Al was obtained as a compositional variation XO in Ti and Al.

The results are also shown in Tables 7 and 8.

TABLE 1

| | | Mixing composition (mass %) | | | | | |
|---|---|---|---|---|---|---|---|
| Type | | Co | TiC | TaC | NbC | Cr$_3$C$_2$ | WC |
| Tool body | A | 8.0 | 1.5 | — | 3.0 | 0.4 | Remainder |
| | B | 8.5 | — | 1.8 | 0.2 | — | Remainder |
| | C | 7.0 | — | — | — | — | Remainder |

TABLE 2

| | | Mixing composition (mass %) | | | | | | |
|---|---|---|---|---|---|---|---|---|
| Type | | Co | Ni | ZrC | NbC | Mo$_2$C | WC | TiCN |
| Tool body | D | 8 | 5 | 1 | 6 | 6 | 10 | Remainder |

TABLE 3

| Constituent layers of hard coating layer | | | Forming conditions (pressure of reaction atmosphere is expressed as kPa and temperature is expressed as ° C.) | | |
|---|---|---|---|---|---|
| Type | Formation symbol | Reaction gas composition (% by volume) | | Reaction atmosphere | |
| | | | | Pressure | Temperature |
| $(Ti_{1-x}Al_x)(C_yN_{1-y})$ layer | TiAlCN | TiAlCN | See Tables 4 and 5 | | |
| Ti compound layer | TiC | TiC | $TiCl_4$: 4.0%, $CH_4$: 7.5%, $H_2$: remainder | 7 | 1000 |
| | TiN | TiN | $TiCl_4$: 4.0%, $N_2$: 30%, $H_2$: remainder | 30 | 780 |
| | TiCN | TiCN | $TiCl_4$: 2%, $CH_3CN$: 0.7%, $N_2$: 10%, $H_2$: remainder | 7 | 780 |
| | TiCNO | TiCNO | $TiCl_4$: 1%, CO: 0.5%, $CO_2$: 1%, $CH_3CN$: 1%, $N_2$: 10%, $H_2$: remainder | 7 | 780 |
| $Al_2O_3$ layer | $Al_2O_3$ | $Al_2O_3$ | $AlCl_3$: 1.2%, $CO_2$: 5.5%, HCl: 2.2%, $H_2S$: 0.2%, $H_2$: remainder | 7 | 800 |

TABLE 4

Forming conditions (reaction gas composition indicates proportion in total amount of gas group A and gas group B, and pressure of reaction atmosphere is expressed as kPa and temperature is expressed as ° C.)

| Formation of hard coating layer | | Gas group A | | | Gas group B | | | Phase difference in supply between gas group A and gas group B | Reaction atmosphere | |
|---|---|---|---|---|---|---|---|---|---|---|
| Process type | Formation symbol | Reaction gas group A composition (% by volume) | Supply period (sec) | Supply time per one period (sec) | Reaction gas group B composition (% by volume) | Supply period (sec) | Supply time per one period (sec) | | Pressure | Temperature |
| Present invention film forming process | A | $NH_3$: 1.0%, $N_2$: 0.0%, $H_2$: 55%, | 1 | 0.2 | $AlCl_3$: 0.7%, $TiCl_4$: 0.2%, $N_2$: 0%, $Al(CH_3)_3$: 0%, $H_2$ as remainder | 1 | 0.2 | 0.1 | 4.7 | 700 |
| | B | $NH_3$: 1.0%, $N_2$: 5.0%, $H_2$: 60%, | 3 | 0.15 | $AlCl_3$: 0.7%, $TiCl_4$: 0.3%, $N_2$: 0%, $Al(CH_3)_3$: 0.5%, $H_2$ as remainder | 3 | 0.15 | 0.15 | 4.5 | 780 |
| | C | $NH_3$: 1.5%, $N_2$: 0.0%, $H_2$: 55%, | 2 | 0.25 | $AlCl_3$: 0.9%, $TiCl_4$: 0.3%, $N_2$: 0%, $Al(CH_3)_3$: 0%, $H_2$ as remainder | 2 | 0.25 | 0.2 | 5 | 800 |
| | D | $NH_3$: 1.0%, $N_2$: 1.0%, $H_2$: 55%, | 5 | 0.2 | $AlCl_3$: 0.6%, $TiCl_4$: 0.2%, $N_2$: 5%, $Al(CH_3)_3$: 0%, $H_2$ as remainder | 5 | 0.2 | 0.1 | 4.7 | 800 |
| | E | $NH_3$: 1.5%, $N_2$: 0.0%, $H_2$: 60%, | 4 | 0.2 | $AlCl_3$: 0.8%, $TiCl_4$: 0.3%, $N_2$: 9%, $Al(CH_3)_3$: 0.2%, $H_2$ as remainder | 4 | 0.2 | 0.15 | 5 | 850 |
| | F | $NH_3$: 1.0%, $N_2$: 2.5%, $H_2$: 55%, | 2.5 | 0.2 | $AlCl_3$: 0.7%, $TiCl_4$: 0.3%, $N_2$: 10%, $Al(CH_3)_3$: 0%, $H_2$ as remainder | 2.5 | 0.2 | 0.2 | 4.5 | 750 |
| | G | $NH_3$: 1.0%, $N_2$: 0.0%, $H_2$: 60%, | 1.5 | 0.15 | $AlCl_3$: 0.8%, $TiCl_4$: 0.2%, $N_2$: 12%, $Al(CH_3)_3$: 0%, $H_2$ as remainder | 1.5 | 0.15 | 0.2 | 4.7 | 800 |
| | H | $NH_3$: 1.0%, $N_2$: 3.5%, $H_2$: 60%, | 1.2 | 0.25 | $AlCl_3$: 0.9%, $TiCl_4$: 0.2%, $N_2$: 3%, $Al(CH_3)_3$: 0%, $H_2$ as remainder | 1.2 | 0.25 | 0.1 | 4.7 | 900 |
| | I | $NH_3$: 1.5%, $N_2$: 0.0%, $H_2$: 55%, | 4.5 | 0.2 | $AlCl_3$: 0.6%, $TiCl_4$: 0.3%, $N_2$: 7%, $Al(CH_3)_3$: 0%, $H_2$ as remainder | 4.5 | 0.2 | 0.15 | 4.7 | 800 |

TABLE 5

Forming conditions (reaction gas composition indicates proportion in total amount of gas group A and gas group B, and pressure of reaction atmosphere is expressed as kPa and temperature is expressed as °C.)

| Formation of hard coating layer | | Gas group A | | | Gas group B | | | Phase difference in supply between gas group A and gas group B | Reaction atmosphere | |
|---|---|---|---|---|---|---|---|---|---|---|
| Process type | Formation symbol | Reaction gas group A composition (% by volume) | Supply period (sec) | Supply time per one period (sec) | Reaction gas group B composition (% by volume) | Supply period (sec) | Supply time per one period (sec) | | Pressure | Temperature |
| Comparative film forming process | A' | NH$_3$: 1.0%, N$_2$: 0.0%, H$_2$: 55%, | — | — | AlCl$_3$: 0.7%, TiCl$_4$: 0.2%, N$_2$: 0%, Al(CH$_3$)$_3$: 0%, H$_2$ as remainder | — | — | — | 4.7 | 700 |
| | B' | NH$_3$: 1.0%, N$_2$: 5.0%, H$_2$: 60%, | — | — | AlCl$_3$: 0.7%, TiCl$_4$: 0.3%, N$_2$: 0%, Al(CH$_3$)$_3$: 0%, H$_2$ as remainder | — | — | — | 4.5 | 780 |
| | C' | NH$_3$: 1.5%, N$_2$: 0.0%, H$_2$: 55%, | — | — | AlCl$_3$: 0.9%, TiCl$_4$: 0.3%, N$_2$: 0%, Al(CH$_3$)$_3$: 0.5%, H$_2$ as remainder | — | — | — | 5 | 800 |
| | D' | NH$_3$: 1.0%, N$_2$: 1.0%, H$_2$: 55%, | — | — | AlCl$_3$: 0.6%, TiCl$_4$: 0.2%, N$_2$: 5%, Al(CH$_3$)$_3$: 0%, H$_2$ as remainder | — | — | — | 4.7 | 800 |
| | E' | NH$_3$: 1.5%, N$_2$: 3.0%, H$_2$: 60%, | — | — | AlCl$_3$: 0.8%, TiCl$_4$: 0.3%, N$_2$: 9%, Al(CH$_3$)$_3$: 0%, H$_2$ as remainder | — | — | — | 5 | 850 |
| | F' | NH$_3$: 1.0%, N$_2$: 2.5%, H$_2$: 55%, | — | — | AlCl$_3$: 0.7%, TiCl$_4$: 0.3%, N$_2$: 10%, Al(CH$_3$)$_3$: 0.2%, H$_2$ as remainder | — | — | — | 4.5 | 750 |
| | G' | NH$_3$: 1.0%, N$_2$: 0.0%, H$_2$: 60%, | — | — | AlCl$_3$: 0.6%, TiCl$_4$: 0.2%, N$_2$: 12%, Al(CH$_3$)$_3$: 0%, H$_2$ as remainder | — | — | — | 4.7 | 800 |
| | H' | NH$_3$: 1.0%, N$_2$: 3.5%, H$_2$: 60%, | — | — | AlCl$_3$: 0.9%, TiCl$_4$: 0.2%, N$_2$: 3%, Al(CH$_3$)$_3$: 0%, H$_2$ as remainder | — | — | — | 4.7 | 900 |
| | I' | NH$_3$: 1.5%, N$_2$: 2.0%, H$_2$: 55%, | — | — | AlCl$_3$: 0.6%, TiCl$_4$: 0.3%, N$_2$: 7%, Al(CH$_3$)$_3$: 0.4%, H$_2$ as remainder | — | — | — | 4.7 | 800 |

TABLE 6

| | | Tool body symbol | Hard coating layer (numerical value at the bottom indicates target average layer thickness (μm)) | | | |
|---|---|---|---|---|---|---|
| | | | Lower layer | | Upper layer | |
| Type | | | First layer | Second layer | First layer | Second layer |
| Present invention coated tool, comparative coated tool, reference coated tool | 1 | A | — | — | — | — |
| | 2 | D | — | — | — | — |
| | 3 | B | TiN (0.3) | — | — | — |
| | 4 | C | TiN (0.3) | — | — | — |
| | 5 | A | TiN (0.3) | — | — | — |
| | 6 | D | TiN (0.3) | — | Al$_2$O$_3$ (2) | — |
| | 7 | B | TiN (0.3) | — | TiCNO (0.3) | Al$_2$O$_3$ (1.5) |
| | 8 | C | TiC (0.5) | — | — | — |
| | 9 | A | TiN (0.3) | TiCN (2) | — | — |

TABLE 7

| Type | | Tool body symbol | Formation symbol of TiAlCN film forming process (see Table 4) | Hard coating layer Layer of complex nitride or complex carbonitride of Ti and Al (Ti$_{1-x}$Al$_x$)(C$_y$N$_{1-y}$) | | | | | |
|---|---|---|---|---|---|---|---|---|---|
| | | | | Average amount Xavg of Al | Average amount Yavg of C | Difference Dx between average of maximum values of x and an average of minimum values | Division of inclined angles in which highest peak is present in inclined angle frequency distribution (degrees) | Proportion of frequencies of 0 degrees to 10 degrees in inclined angle division in inclined angle frequency distribution (%) | Average grain width W of cubic grains (mm) |
| Present invention coated tool | 1 | A | A | 0.92 | 0.0001 or less | 0.18 | 3.5 to 3.75 | 48.0 | 0.3 |
| | 2 | D | B | 0.65 | 0.004 | 0.21 | 6.25 to 6.5 | 50.0 | 0.2 |
| | 3 | B | C | 0.87 | 0.0001 or less | 0.12 | 0.5 to 0.75 | 65.0 | 1.5 |
| | 4 | C | D | 0.83 | 0.0001 or less | 0.10 | 1.5 to 1.75 | 55.0 | 1.2 |
| | 5 | A | E | 0.78 | 0.0018 | 0.05 | 1.25 to 1.5 | 68.0 | 0.8 |
| | 6 | D | F | 0.68 | 0.0001 or less | 0.14 | 0 to 0.25 | 75.0 | 0.5 |
| | 7 | B | G | 0.81 | 0.0001 or less | 0.07 | 1.75 to 2.0 | 70.0 | 0.9 |
| | 8 | C | H | 0.75 | 0.0001 or less | 0.04 | 5 to 5.25 | 80.0 | 0.8 |
| | 9 | A | I | 0.88 | 0.0001 or less | 0.08 | 8.75 to 9.0 | 68.0 | 1.9 |

| Type | | Hard coating layer Layer of complex nitride or complex carbonitride of Ti and Al (Ti$_{1-x}$Al$_x$)(C$_y$N$_{1-y}$) | | | | | | |
|---|---|---|---|---|---|---|---|---|
| | | Average aspect ratio A of cubic grains | Average value of periods of compositional change in Ti and Al along <001> orientation (nm) | Compositional variation XO in amount of Al in plane orthogonal to periodic compositional change along <001> orientation | Lattice constant of grains having NaCl type face-centered cubic structure (Å) | Area proportion of hexagonal fine grains (% by area) | Average grain size R of hexagonal fine grains (mm) | Target layer thickness (mm) |
| Present invention coated tool | 1 | 5.00 | 15 | 0.02 | 4.061 | 0 | — | 2.5 |
| | 2 | 8.00 | 35 | 0.01 or less | 4.114 | 0 | — | 6.5 |
| | 3 | 3.50 | 45 | 0.01 or less | 4.071 | 0 | — | 4 |
| | 4 | 4.50 | 25 | 0.01 or less | 4.078 | 0 | — | 3.5 |
| | 5 | 3.00 | 75 | 0.01 or less | 4.088 | 15 | 0.15 | 5 |
| | 6 | 4.00 | 10 | 0.01 or less | 4.108 | 0 | — | 3 |
| | 7 | 5.00 | 60 | 0.01 or less | 4.082 | 0 | — | 6 |
| | 8 | 6.00 | 25 | 0.01 or less | 4.094 | 30.00 | 0.08 | 2 |
| | 9 | 2.20 | 90 | 0.01 or less | 4.069 | 0 | — | 4 |

TABLE 8

Hard coating layer
Layer of complex nitride or complex carbonitride of Ti and Al $(Ti_{1-x}Al_x)(C_yN_{1-y})$

| Type | | Tool body symbol | Formation symbol of TiAlCN film forming process (see Table 5) | Average amount Xavg of Al | Average amount Yavg of C | Division of inclined angles in which highest peak is present in inclined angle frequency distribution (degrees) | Proportion of frequencies of 0 degrees to 10 degrees in inclined angle division in inclined angle frequency distribution (%) | Average grain width W of cubic grains (mm) | Average aspect ratio A of cubic grains |
|---|---|---|---|---|---|---|---|---|---|
| Comparative coated tool | 1 | A | A' | 0.93 | 0.0001 or less | 8.0 to 8.25 | 35.0 | 1.5 | 3 |
| | 2 | D | B' | 0.82 | 0.0001 or less | 11.0 to 11.25 | 30.0 | 1.8 | 4 |
| | 3 | B | C' | 0.65 | 0.008 | 22.25 to 22.5 | 18.0 | 1.2 | 1.2 |
| | 4 | C | D' | 0.77 | 0.0001 or less | 15.25 to 15.5 | 26.0 | 0.9 | 5 |
| | 5 | A | E' | 0.94 | 0.0001 or less | 18.75 to 19 | 33.0 | 2.2 | 2 |
| | 6 | D | F' | 0.87 | 0.004 | 9.5 to 9.75 | 25.0 | 1.6 | 1.2 |
| | 7 | B | G' | 0.64 | 0.0001 or less | 31.25 to 31.5 | 26.0 | 0.8 | 3.5 |
| | 8 | C | H' | 0.81 | 0.0001 or less | 23.75 to 24 | 29.0 | 0.9 | 3.8 |
| | 9 | A | I' | 0.78 | 0.0025 | 29.25 to 29.5 | 19.0 | 1.9 | 1.3 |
| Reference coated tool | 10 | B | AIP | 0.48 | — | — | — | 1.2 | 3.5 |

Hard coating layer
Layer of complex nitride or complex carbonitride of Ti and Al $(Ti_{1-x}Al_x)(C_yN_{1-y})$

| Type | | Difference Dx between average of maximum values of x and an average of minimum values | Average value of periods of compositional change in Ti and Al along <001> orientation (nm) | Compositional variation XO in amount of Al in plane orthogonal to periodic compositional change along <001> orientation | Lattice constant of grains having NaCl type face-centered cubic structure (Å) | Area proportion of hexagonal fine grains (% by area) | Average grain size R of hexagonal fine grains (mm) | Target layer thickness (mm) |
|---|---|---|---|---|---|---|---|---|
| Comparative coated tool | 1 | — | — | — | 4.059 | 35 | 0.25 | 2.5 |
| | 2 | — | — | — | 4.080 | 3 | 0.04 | 6.5 |
| | 3 | — | — | — | 4.114 | 10 | 0.23 | 4 |
| | 4 | — | — | — | 4.090 | 5 | 0.18 | 3.5 |
| | 5 | — | — | — | 4.057 | 12 | 0.23 | 5 |
| | 6 | — | — | — | 4.071 | 28 | 0.35 | 3 |
| | 7 | — | — | — | 4.116 | 16 | 0.12 | 6 |
| | 8 | — | — | — | 4.082 | 32 | 0.21 | 2 |
| | 9 | — | — | — | 4.088 | 18.0 | 0.2 | 4 |
| Reference coated tool | 10 | — | — | — | 4.147 | — | — | 3.5 |

Next, in a state in which each of the various coated tools was clamped to a cutter tip end portion made of tool steel with a cutter diameter of 125 mm by a fixing tool, the present invention coated tools 1 to 9, the comparative coated tools 1 to 9, and the reference coated tool 10 were subjected to dry high-speed face milling, which is a type of alloy steel high-speed intermittent cutting, and a center-cut cutting test, which are described below, and the flank wear width of a cutting edge was measured. The results are shown in Table 9.

Tool body: tungsten carbide-based cemented carbide, titanium carbonitride-based cermet Cutting test: dry high-speed face milling, center-cut cutting Work material: a JIS SCM440 block material with a width of 100 mm and a length of 400 mm Rotational speed: 968 min$^{-1}$ Cutting speed: 380 m/min Depth of cut: 1.0 mm Feed per edge: 0.1 mm/edge Cutting time: 8 minutes (a typical cutting speed is 220 m/min)

TABLE 9

| Type | | Flank wear width (mm) | Type | | Cutting test results (min) |
|---|---|---|---|---|---|
| Present invention coated tool | 1 | 0.22 | Comparative coated tool | 1 | 4.5* |
| | 2 | 0.28 | | 2 | 2.5* |
| | 3 | 0.15 | | 3 | 6.8* |
| | 4 | 0.18 | | 4 | 5.3* |
| | 5 | 0.27 | | 5 | 3.1* |
| | 6 | 0.19 | | 6 | 2.8* |
| | 7 | 0.26 | | 7 | 3.6* |
| | 8 | 0.24 | | 8 | 1.8* |
| | 9 | 0.17 | | 9 | 7.2* |
| | | | Reference coated tool | 10 | 2.1* |

Mark * in boxes of comparative coated tools and reference coated tools indicates a cutting time (min) until the end of a service life caused by the occurrence of chipping.

Example 2

As raw material powders, a WC powder, a TiC powder, a ZrC powder, a TaC powder, an NbC powder, a $Cr_3C_2$ powder, a TiN powder, and a Co powder, all of which had an average grain size of 1 μm to 3 μm, were prepared, and the raw material powders were mixed in mixing compositions shown in Table 10. Wax was further added thereto, and the mixture was blended in acetone by a ball mill for 24 hours and was decompressed and dried. Thereafter, the resultant was press-formed into compacts having predetermined shapes at a pressure of 98 MPa, and the compacts were sintered in a vacuum at 5 Pa under the condition that the compacts were held at a predetermined temperature in a range of 1370° C. to 1470° C. for one hour. After the sintering, a cutting edge portion was subjected to honing to have a radius R of 0.07 mm, thereby forming tool bodies α to γ made of WC-based cemented carbide with insert shapes according to ISO standard CNMG120412.

In addition, as raw material powders, a TiCN (TiC/TiN=50/50 in terms of mass ratio) powder, an NbC powder, a WC powder, a Co powder, and an Ni powder, all of which had an average grain size of 0.5 μm to 2 μm, were prepared, and the raw material powders were mixed in mixing compositions shown in Table 11, were subjected to wet mixing by a ball mill for 24 hours, and were dried. Thereafter, the resultant was press-formed into compacts at a pressure of 98 MPa, and the compacts were sintered in a nitrogen atmosphere at 1.3 kPa under the condition that the compacts were held at a temperature of 1500° C. for one hour. After the sintering, a cutting edge portion was subjected to honing to have a radius R of 0.09 mm, thereby forming a tool body δ made of TiCN-based cermet with an insert shape according to ISO standard CNMG120412.

Subsequently, present invention coated tools 11 to shown in Table 13 were produced by depositing hard coating layers including at least a $(Ti_{1-x}Al_x)(C_yN_{1-y})$ layer on the surfaces of the tool bodies α to γ and the tool body δ to have target layer thicknesses using a chemical vapor deposition apparatus under the conditions shown in Tables 3 and 4 in the same method as that in Example 1.

In addition, any of a lower layer and an upper layer shown in Table 12 was formed on the present invention coated tools 13 to 19 under the forming conditions shown in Table 3.

In addition, for the purpose of comparison, like the present invention coated tools, comparative coated tools 11 to 19 shown in Table 14 were produced by depositing hard coating layers on the surfaces of the same tool bodies α to γ and the tool body δ to have target layer thicknesses shown in FIG. 13 under the conditions shown in Tables 3 and 5 using a typical chemical vapor deposition apparatus.

In addition, like the present invention coated tools 13 to 19, any of a lower layer and an upper layer shown in Table 12 was formed on the comparative coated tools 13 to 19 under the forming conditions shown in Table 3.

For reference, a reference coated tool 20 shown in Table 14 was produced by depositing $(Ti_{1-x}Al_x)(C_yN_{1-y})$ layers of the reference example on the surfaces of the tool body β to have target layer thicknesses through arc ion plating using a physical vapor deposition apparatus in the related art.

The same conditions as those described in Example 1 were used as the conditions of the arc ion plating.

The section of each of constituent layers of the present invention coated tools 11 to 19, the comparative coated tools 11 to 19, and the reference coated tool 20 was measured using a scanning electron microscope (at a magnification of 5000×). An average layer thickness was obtained by measuring and averaging the layer thicknesses of five points in an observation visual field. All of the results showed substantially the same average layer thicknesses as the target layer thicknesses shown in Tables 12 to 14.

Regarding the hard coating layers of the present invention coated tools 11 to 19, the comparative coated tools 11 to 19, and the reference coated tool 20, using the same method as that described in Example 1, the average amount Xavg of Al, the average amount Yavg of C, the average grain width W and the average aspect ratio A of crystal grains having a cubic structure included in the $(Ti_{1-x}Al_x)(C_yN_{1-y})$ layer of a columnar structure were calculated. In addition, using the same method as that described in Example 1, inclined angles of normal lines of {111} planes which were crystal planes of the crystal grains having an NaCl type face-centered cubic structure with respect to the normal line (the direction perpendicular to the surface of the body in the section polished surface) of the surface of the body were measured. On the basis of the measurement results, measured inclined angles in a range of 0 degrees to 45 degrees among the measured inclined angles were divided into intervals of 0.25 degrees, frequencies in the respective divisions were aggregated, and the presence of the peaks of the frequencies present in a range of 0 degrees to 10 degrees was checked. In addition, the proportion of the frequencies present in the range of 0 degrees to 10 degrees was obtained.

Moreover, the average grain size R of fine crystal grains that were present in the grain boundaries of the columnar structure constituted by the individual crystal grains having an NaCl type face-centered cubic structure and the area proportion of the fine crystal grains were calculated using the same method as that described in Example 1.

The results are shown in Tables 13 and 14.

Regarding a layer of a complex nitride or complex carbonitride of Ti and Al included in the hard coating layers of the present invention coated tools 11 to 19, a plurality of visual fields were observed using a scanning electron microscope (at a magnification of 5000× and 20,000×). As illustrated in the film configuration schematic view in FIG. 1, a $(Ti_{1-x}Al_x)(C_yN_{1-y})$ layer of a columnar structure in which NaCl type face-centered cubic crystals and hexagonal crystals were present was confirmed. In addition, it was confirmed through line analysis by energy-dispersive X-ray spectroscopy (EDS) using the transmission electron microscope (at a magnification of 200,000×) that a periodic compositional variation of Ti and Al was present in the NaCl type face-centered cubic crystal grains. As a result of more detailed analysis, it was confirmed that Δx between the average of the maximum values of x and the average of the minimum values thereof was 0.03 to 0.25.

In addition, regarding the layer of a complex nitride or complex carbonitride, the columnar structure constituted by the individual crystal grains having a cubic structure were analyzed in the longitudinal sectional direction of the layer of a complex nitride or complex carbonitride of Ti and Al using an electron backscatter diffraction apparatus, and it was confirmed that the fine crystal grains present in the grain boundaries had a hexagonal structure.

TABLE 10

| Type | Mixing composition (mass %) | | | | | | | |
|---|---|---|---|---|---|---|---|---|
| | Co | TiC | ZrC | TaC | NbC | $Cr_3C_2$ | TiN | WC |
| Tool body α | 6.5 | — | 1.5 | — | 2.9 | 0.1 | 1.5 | Remainder |
| Tool body β | 7.6 | 2.6 | — | 4.0 | 0.5 | — | 1.1 | Remainder |
| Tool body γ | 6.0 | — | — | — | — | — | — | Remainder |

TABLE 11

| Type | Mixing composition (mass %) | | | | |
|---|---|---|---|---|---|
| | Co | Ni | NbC | WC | TiCN |
| Tool body δ | 11 | 4 | 6 | 15 | Remainder |

TABLE 12

| Type | Tool body symbol | Hard coating layer (numerical value at the bottom indicates target average layer thickness (μm)) | | | |
| --- | --- | --- | --- | --- | --- |
| | | Lower layer | | Upper layer | |
| | | First layer | Second layer | First layer | Second layer |
| Present invention coated tool, comparative coated tool, reference coated tool | 11 α | — | — | — | — |
| | 12 δ | — | — | — | — |
| | 13 β | TiN (0.3) | — | — | — |
| | 14 γ | TiN (0.3) | — | — | — |
| | 15 α | TiN (0.3) | — | — | — |
| | 16 δ | TiN (0.3) | — | Al$_2$O$_3$ (2.5) | — |
| | 17 β | TiN (0.3) | — | TiCNO (0.3) | Al$_2$O$_3$ (3.5) |
| | 18 γ | TiC (0.5) | — | — | — |
| | 19 α | TiN (0.3) | TiCN (5) | — | — |

TABLE 13

| Type | | Tool body symbol | Formation symbol of TiAlCN film forming process (see Table 4) | Average amount Xavg of Al | Average amount Yavg of C | Difference Dx between average of maximum values of x and an average of minimum values | Division of inclined angles in which highest peak is present in inclined angle frequency distribution (degrees) | Proportion of frequencies of 0 degrees to 10 degrees in inclined angle division in inclined angle frequency distribution (%) | Average grain width W of cubic grains (mm) |
| --- | --- | --- | --- | --- | --- | --- | --- | --- | --- |
| Present invention coated tool | 11 | α | A | 0.90 | 0.0001 or less | 0.14 | 1.25-1.5 | 46 | 0.35 |
| | 12 | δ | B | 0.68 | 0.003 | 0.19 | 5.25-5.5 | 48 | 0.12 |
| | 13 | β | C | 0.85 | 0.0001 or less | 0.13 | 1.25-1.5 | 72 | 2.2 |
| | 14 | γ | D | 0.86 | 0.0001 or less | 0.09 | 2.25-2.5 | 68 | 1.8 |
| | 15 | α | E | 0.79 | 0.0012 | 0.06 | 1.75-2.0 | 78 | 1.6 |
| | 16 | δ | F | 0.71 | 0.0001 or less | 0.13 | 3.25-3.5 | 72 | 0.8 |
| | 17 | β | G | 0.83 | 0.0001 or less | 0.11 | 3.75-4.0 | 66 | 1.1 |
| | 18 | γ | H | 0.77 | 0.0001 or less | 0.05 | 7.25-7.5 | 83 | 1.6 |
| | 19 | α | I | 0.84 | 0.0001 or less | 0.09 | 8.25-8.5 | 71 | 1.8 |

| Type | | Average aspect ratio A of cubic grains | Average value of periods of compositional change in Ti and Al along <001> orientation (nm) | Compositional variation XO in amount of Al in plane orthogonal to periodic compositional change along <001> orientation | Lattice constant of grains having NaCl type face-centered cubic structure (Å) | Area proportion of hexagonal fine grains (% by area) | Average grain size R of hexagonal fine grains (mm) | Target layer thickness (mm) |
| --- | --- | --- | --- | --- | --- | --- | --- | --- |
| Present invention coated tool | 11 | 3.6 | 16 | 0.015 | 4.065 | 0 | — | 3.5 |
| | 12 | 2.3 | 33 | 0.01 or less | 4.108 | 0 | — | 2.5 |
| | 13 | 3.8 | 48 | 0.01 or less | 4.075 | 0 | — | 10.0 |
| | 14 | 5 | 23 | 0.01 or less | 4.073 | 0 | — | 7.0 |
| | 15 | 7 | 85 | 0.01 or less | 4.086 | 18 | 0.15 | 20.0 |
| | 16 | 3.5 | 12 | 0.01 or less | 4.102 | 0 | — | 10.0 |
| | 17 | 6.5 | 65 | 0.01 or less | 4.078 | 0 | — | 6.0 |
| | 18 | 7 | 33 | 0.01 or less | 4.090 | 25 | 0.11 | 9.0 |
| | 19 | 1.8 | 78 | 0.01 or less | 4.076 | 0 | — | 5.0 |

TABLE 14

| Type | Tool body symbol | Formation symbol of TiAlCN film forming process (see Table 5) | Average amount Xavg of Al | Average amount Yavg of C | Division of inclined angles in which highest peak is present in inclined angle frequency distribution (degrees) | Proportion of frequencies of 0 degrees to 10 degrees in inclined angle division in inclined angle frequency distribution (%) | Average grain width W of cubic grains (mm) | Average aspect ratio A of cubic grains |
|---|---|---|---|---|---|---|---|---|
| Comparative coated tool | 11 a | A' | 0.91 | 0.0001 or less | 11.5 to 11.75 | 25.0 | 2.1 | 2.5 |
| | 12 d | B' | 0.83 | 0.0001 or less | 34.25 to 34.5 | 31.0 | 1.3 | 4.5 |
| | 13 b | C' | 0.67 | 0.011 | 41.25 to 41.5 | 19.0 | 1.5 | 1.6 |
| | 14 g | D' | 0.73 | 0.0001 or less | 27.5 to 27.75 | 22.0 | 0.8 | 5.5 |
| | 15 a | E' | 0.96 | 0.0001 or less | 31.25 to 31.5 | 23.0 | 2.4 | 3 |
| | 16 d | F' | 0.88 | 0.005 | 36.25 to 36.5 | 31.0 | 1.5 | 1.5 |
| | 17 b | G' | 0.62 | 0.0001 or less | 23.5 to 23.75 | 18.0 | 1.2 | 3.2 |
| | 18 g | H' | 0.78 | 0.0001 or less | 17.5 to 17.75 | 26.0 | 1.3 | 4.4 |
| | 19 a | I' | 0.8 | 0.003 | 39.25 to 39.5 | 22.5 | 1.6 | 2.3 |
| Reference coated tool | 20 b | AIP | 0.48 | — | — | — | 1.2 | 3.5 |

| Type | | Difference Dx between average of maximum values of x and an average of minimum values | Average value of periods of compositional change in Ti and Al along <001> orientation (nm) | Compositional variation XO in amount of Al in plane orthogonal to periodic compositional change along <001> orientation | Lattice constant of grains having NaCl type face-centered cubic structure (Å) | Area proportion of hexagonal fine grains (% by area) | Average grain size R of hexagonal fine grains (mm) | Target layer thickness (mm) |
|---|---|---|---|---|---|---|---|---|
| Comparative coated tool | 11 | — | — | — | 4.063 | 28 | 0.23 | 3.5 |
| | 12 | — | — | — | 4.078 | 5 | 0.06 | 2.5 |
| | 13 | — | — | — | 4.110 | 15 | 0.21 | 10.0 |
| | 14 | — | — | — | 4.098 | 7 | 0.25 | 7.0 |
| | 15 | — | — | — | 4.053 | 13 | 0.18 | 20.0 |
| | 16 | — | — | — | 4.069 | 25 | 0.34 | 10.0 |
| | 17 | — | — | — | 4.120 | 12 | 0.15 | 6.0 |
| | 18 | — | — | — | 4.088 | 34 | 0.26 | 9.0 |
| | 19 | — | — | — | 4.084 | 16 | 0.18 | 5.0 |
| Reference coated tool | 20 | — | — | — | 4.147 | — | — | 3.5 |

(Note)
"AIP" indicates film formation through arc ion plating.

Next, in a state in which each of the various coated tools was screwed to a tip end portion of an insert holder made of tool steel by a fixing tool, the present invention coated tools 11 to 19, the comparative coated tools 11 to 19, and the reference coated tool 20 were subjected to a dry high-speed intermittent cutting test for carbon steel and a wet high-speed intermittent cutting test for cast iron, which are described below, and the flank wear width of a cutting edge was measured.

Cutting conditions 1:
Work material: a round bar with four longitudinal grooves formed at equal intervals in the longitudinal direction of JIS SCM435
Cutting speed: 380 m/min
Depth of cut: 1.5 mm
Feed rate: 0.2 mm/rev
Cutting time: 5 minutes
(a typical cutting speed is 220 m/min)

Cutting conditions 2:
Work material: a round bar with four longitudinal grooves formed at equal intervals in the longitudinal direction of JIS FCD700
Cutting speed: 320 m/min
Depth of cut: 1.0 mm
Feed rate: 0.2 mm/rev
Cutting time: 5 minutes
(a typical cutting speed is 180 m/min)

The results of the cutting test are shown in Table 15.

TABLE 15

| | | Flank wear width (mm) | | | Cutting test result (min) | |
|---|---|---|---|---|---|---|
| Type | | Cutting conditions 1 | Cutting conditions 2 | Type | Cutting conditions 1 | Cutting conditions 2 |
| Present invention | 11 | 0.26 | 0.28 | Comparative coated tool | 11 2.3* | 3.5* |
| | 12 | 0.25 | 0.31 | | 12 3.6* | 3.2* |

TABLE 15-continued

| | | Flank wear width (mm) | | | | Cutting test result (min) | |
|---|---|---|---|---|---|---|---|
| Type | | Cutting conditions 1 | Cutting conditions 2 | Type | | Cutting conditions 1 | Cutting conditions 2 |
| coated tool | 13 | 0.19 | 0.21 | | 13 | 2.1* | 3.6* |
| | 14 | 0.12 | 0.13 | | 14 | 4.2* | 3.3* |
| | 15 | 0.15 | 0.17 | | 15 | 4.8* | 2.1* |
| | 16 | 0.18 | 0.16 | | 16 | 3.6* | 2.3* |
| | 17 | 0.11 | 0.14 | | 17 | 1.8* | 2.5* |
| | 18 | 0.22 | 0.24 | | 18 | 1.9* | 2.8* |
| | 19 | 0.23 | 0.21 | | 19 | 2.3* | 2.1* |
| | | | | Reference coated tool | 20 | 1.2* | 1.5* |

Mark * in boxes of comparative coated tools and reference coated tools indicates a cutting time (min) until the end of a service life caused by the occurrence of chipping.

Example 3

As raw material powders, a cBN powder, a TiN powder, a TiC powder, an Al powder, and an $Al_2O_3$ powder, all of which had an average grain size of 0.5 μm to 4 μm, were prepared, and the raw material powders were mixed in mixing compositions shown in Table 16. The mixture was wet-blended by a ball mill for 80 hours and was dried. Thereafter, the resultant was press-formed into compacts having dimensions with a diameter of 50 mm and a thickness of 1.5 mm at a pressure of 120 MPa, and the compacts were then sintered in a vacuum at a pressure of 1 Pa under the condition that the compacts were held at a predetermined temperature in a range of 900° C. to 1300° C. for 60 minutes, thereby producing cutting edge preliminary sintered bodies. In a state in which the preliminary sintered body was superimposed on a support piece made of WC-based cemented carbide, which was additionally prepared to contain Co: 8 mass % and WC: the remainder and have dimensions with a diameter of 50 mm and a thickness of 2 mm, the resultant was loaded in a typical ultrahigh-pressure sintering apparatus, and was subjected to ultrahigh-pressure sintering under typical conditions including a pressure of 4 GPa, a predetermined temperature in a range of 1200° C. to 1400° C., and a holding time of 0.8 hours. After the sintering, upper and lower surfaces were polished using a diamond grinding wheel, and were split into predetermined dimensions by a wire electric discharge machining apparatus. Furthermore, the resultant was brazed to a brazing portion (corner portion) of an insert body made of WC-based cemented carbide having a composition including Co: 5 mass %, TaC: 5 mass %, and WC: the remainder and a shape (a 80° rhombic shape with a thickness of 4.76 mm and an inscribed circle diameter of 12.7 mm) according to ISO standard CNGA120412 using a brazing filler metal made of a Ti—Zr—Cu alloy having a composition including Zr: 37.5%, Cu: 25%, and Ti: the remainder in terms of mass %, and the outer circumference thereof was machined into predetermined dimensions. Thereafter, a cutting edge portion was subjected to honing to have a width of 0.13 mm and an angle of 25°, and the resultant was further subjected to finish polishing, thereby producing each of tool bodies a and b with an insert shape according to ISO standard CNGA120412.

TABLE 16

| | | Mixing composition (mass %) | | | | |
|---|---|---|---|---|---|---|
| Type | | TiN | TiC | Al | $Al_2O_3$ | cBN |
| Tool body | a | 50 | — | 5 | 3 | Remainder |
| | b | — | 50 | 4 | 3 | Remainder |

Subsequently, present invention coated tools 21 to shown in Table 18 were produced by depositing hard coating layers including at least a $(Ti_{1-x}Al_x)(C_yN_{1-y})$ layer on the surfaces of the tool bodies a and b to have target layer thicknesses using a typical chemical vapor deposition apparatus under the conditions shown in Tables 3 and 4 in the same method as that in Example 1.

In addition, any of a lower layer and an upper layer shown in Table 17 was formed on the present invention coated tools 22 to 24 under the forming conditions shown in Table 3.

In addition, for the purpose of comparison, comparative coated tools 21 to 24 shown in Table 19 were produced by depositing hard coating layers including at least a $(Ti_{1-x}Al_x)(C_yN_{1-y})$ layer on the surfaces of the same tool bodies a and b to have target layer thicknesses under the conditions shown in Tables 3 and 5 using a typical chemical vapor deposition apparatus.

In addition, like the present invention coated tools 22 to 24, any of a lower layer and an upper layer shown in Table 17 was formed on the comparative coated tools 22 to 24 under the forming conditions shown in Table 3.

For reference, a reference coated tool 25 shown in Table 19 was produced by depositing $(Ti_{1-x}Al_x)(C_yN_{1-y})$ layers on the surfaces of the tool bodies a and b to have target layer thicknesses through arc ion plating using a physical vapor deposition apparatus in the related art.

The same conditions as those described in Example 1 were used as the conditions of the arc ion plating, and the reference coated tool 25 was produced by depositing (Al, Ti)N layers having a target composition and a target layer thickness shown in Table 19 on the surfaces of the tool bodies.

The section of each of constituent layers of the present invention coated tools 21 to 24, the comparative coated tools 21 to 24, and the reference coated tool 25 was measured using a scanning electron microscope (at a magnification of 5000×). An average layer thickness was obtained by measuring and averaging the layer thicknesses of five points in an observation visual field. All of the results showed substantially the same average layer thicknesses as the target layer thicknesses shown in Tables 17 to 19.

Regarding the hard coating layers of the present invention coated tools 21 to 24, the comparative coated tools 21 to 24, and the reference coated tool 25, using the same method as that described in Example 1, the average amount Xavg of Al, the average amount Yavg of C, the average grain width W and the average aspect ratio A of crystal grains having an NaCl type face-centered cubic structure included in the $(Ti_{1-x}Al_x)(C_yN_{1-y})$ layer were calculated. In addition, using the same method as that described in Example 1, inclined angles of normal lines of {111} planes which were crystal planes of the crystal grains having an NaCl type face-centered cubic structure with respect to the normal line (the direction perpendicular to the surface of the body in the section polished surface) of the surface of the body were measured. On the basis of the measurement results, measured inclined angles in a range of 0 degrees to 45 degrees among the measured inclined angles were divided into intervals of 0.25 degrees, frequencies in the respective divisions were aggregated, and the presence of the peaks of the frequencies present in a range of 0 degrees to 10 degrees was checked. In addition, the proportion of the frequencies present in the range of 0 degrees to 10 degrees was obtained.

Moreover, the average grain size R of fine crystal grains that were present in the grain boundaries of the columnar structure constituted by the individual crystal grains having an NaCl type face-centered cubic structure and the area proportion of the fine crystal grains were calculated using the same method as that described in Example 1. The results are shown in Tables 18 and 19.

TABLE 17

| Type | Tool body symbol | Hard coating layer (numerical value at the bottom indicates target average layer thickness (μm)) | |
|---|---|---|---|
| | | Lower layer First layer | Upper layer |
| Present invention coated tool, comparative coated tool, reference coated tool | 21 a | — | — |
| | 22 b | TiN (0.3) | — |
| | 23 a | TiN (0.3) | — |
| | 24 b | TiN (0.3) | TiN (0.3) |

TABLE 18

Hard coating layer
Layer of complex nitride or complex carbonitride of Ti and Al $(Ti_{1-x}Al_x)(C_yN_{1-y})$

| Type | Tool body symbol | Formation symbol of TiAlCN film forming process (see Table 4) | Average amount Xavg of Al | Average amount Yavg of C | Difference Dx between average of maximum values of x and an average of minimum values | Division of inclined angles in which highest peak is present in inclined angle frequency distribution (degrees) | Proportion of frequencies of 0 degrees to 10 degrees in inclined angle division in inclined angle frequency distribution (%) | Average grain width W of cubic grains (mm) |
|---|---|---|---|---|---|---|---|---|
| Present invention coated tool | 21 a | A | 0.91 | 0.0001 or less | 0.15 | 5.25 to 5.5 | 55 | 0.4 |
| | 22 b | B | 0.66 | 0.002 | 0.18 | 7.5 to 7.75 | 48 | 0.2 |
| | 23 a | C | 0.85 | 0.0001 or less | 0.09 | 1.25 to 1.5 | 61 | 0.9 |
| | 24 b | D | 0.81 | 0.0001 or less | 0.11 | 2.25 to 2.5 | 53 | 0.8 |

Hard coating layer
Layer of complex nitride or complex carbonitride of Ti and Al $(Ti_{1-x}Al_x)(C_yN_{1-y})$

| Type | | Average aspect ratio A of cubic grains | Average value of periods of compositional change in Ti and Al along <001> orientation (nm) | Compositional variation XO in amount of Al in plane orthogonal to periodic compositional change along <001> orientation | Lattice constant of grains having NaCl type face-centered cubic structure (Å) | Area proportion of hexagonal fine grains (% by area) | Average grain size R of hexagonal fine grains (mm) | Target layer thickness (mm) |
|---|---|---|---|---|---|---|---|---|
| Present invention coated tool | 21 | 3 | 18 | 0.015 | 4.063 | 0 | — | 3.5 |
| | 22 | 5 | 28 | 0.01 or less | 4.112 | 0 | — | 1.2 |
| | 23 | 2.1 | 43 | 0.01 or less | 4.075 | 0 | — | 2.0 |
| | 24 | 2.8 | 26 | 0.01 or less | 4.082 | 0 | — | 2.5 |

TABLE 19

Hard coating layer
Layer of complex nitride or complex carbonitride of Ti and Al $(Ti_{1-x}Al_x)(C_yN_{1-y})$

| Type | Tool body symbol | Formation symbol of TiAlCN film forming process (see Table 5) | Average amount Xavg of Al | Average amount Yavg of C | Division of inclined angles in which highest peak is present in inclined angle frequency distribution (degrees) | Proportion of frequencies of 0 degrees to 10 degrees in inclined angle division in inclined angle frequency distribution (%) | Average grain width W of cubic grains (mm) | Average aspect ratio A of cubic grains |
|---|---|---|---|---|---|---|---|---|
| Comparative coated tool | 21 a | A' | 0.93 | 0.0001 or less | 15.5 to 15.75 | 29.0 | 0.8 | 2.2 |
| | 22 b | B' | 0.85 | 0.0001 or less | 22.25 to 22.5 | 19.0 | 0.6 | 2.5 |
| | 23 a | C' | 0.63 | 0.009 | 38.25 to 38.5 | 23.0 | 0.7 | 1.3 |
| | 24 b | D' | 0.71 | 0.0001 or less | 16 to 16.25 | 27.0 | 0.9 | 2.4 |

TABLE 19-continued

| | Type | | | | | | | | 1.2 | 3.5 |
|---|---|---|---|---|---|---|---|---|---|---|
| Reference coated tool | 25 b | AIP | 0.48 | — | — | — | | | 1.2 | 3.5 |

| | Type | | Difference Dx between average of maximum values of x and an average of minimum values | Average value of periods of compositional change in Ti and Al along <001> orientation (nm) | Compositional variation X0 in amount of Al in plane orthogonal to periodic compositional change along <001> orientation | Hard coating layer Layer of complex nitride or complex carbonitride of Ti and Al $(Ti_{1-x}Al_x)(C_yN_{1-y})$ Lattice constant of grains having NaCl type face-centered cubic structure (Å) | Area proportion of hexagonal fine grains (% by area) | Average grain size R of hexagonal fine grains (mm) | Target layer thickness (mm) |
|---|---|---|---|---|---|---|---|---|---|
| Comparative coated tool | 21 | — | — | — | 4.059 | 23 | 0.25 | 3.5 |
| | 22 | — | — | — | 4.075 | 3 | 0.12 | 1.2 |
| | 23 | — | — | — | 4.118 | 16 | 0.18 | 2.0 |
| | 24 | — | — | — | 4.102 | 5 | 0.26 | 2.5 |
| Reference coated tool | 25 | — | — | — | 4.147 | — | — | 2.5 |

Next, in a state in which each of the various coated tools was screwed to a tip end portion of an insert holder made of tool steel by a fixing tool, the present invention coated tools 21 to 24, the comparative coated tools 21 to 24, and the reference coated tool 25 were subjected to a dry high-speed intermittent cutting test for carburized alloy steel, which is described below, and the flank wear width of a cutting edge was measured.

Tool body: cubic boron nitride-based ultrahigh-pressure sintered body

Cutting test: dry high-speed intermittent cutting test for carburized alloy steel Work material: a round bar with four longitudinal grooves formed at equal intervals in the longitudinal direction of JIS SCr420 (hardness HRC62)

Cutting speed: 240 m/min
Depth of cut: 0.12 mm
Feed rate: 0.1 mm/rev
Cutting time: 4 minutes The results of the cutting test are shown in Table 20.

TABLE 20

| Type | | Flank wear width (mm) | Type | | Cutting test results (min) |
|---|---|---|---|---|---|
| Present invention coated tool | 21 | 0.18 | Comparative coated tool | 21 | 1.5* |
| | 22 | 0.16 | | 22 | 1.2* |
| | 23 | 0.12 | | 23 | 2.2* |
| | 24 | 0.15 | | 24 | 2.8* |
| | | | Reference coated tool | 25 | 1.3* |

Mark * in boxes of comparative coated tools and reference coated tools indicates a cutting time (min) until the end of a service life caused by the occurrence of chipping.

From the results shown in Tables 9, 15, and 20, it is apparent that in the coated tool of the present invention, in the crystal grains having an NaCl type face-centered cubic structure included in the layer of a complex nitride or complex carbonitride of Ti and Al included in the hard coating layer, a periodic compositional variation in Ti and Al is present in the crystal grains, and thus strain is introduced into crystal grains, resulting in an improvement in hardness. In addition, since the columnar structure is included, high wear resistance is exhibited. At the same time, since the fine crystal grains having a hexagonal structure are present in the grain boundaries of the columnar structure, grain boundary sliding is suppressed, resulting in an improvement in toughness. Furthermore, since the crystal grains having an NaCl type face-centered cubic structure are aligned with {111} planes, both flank wear resistance and crater wear resistance are improved. As a result, the coated tool of the present invention exhibits excellent wear resistance as well as excellent chipping resistance and defect resistance during long-term use even in a case of being used for high-speed intermittent cutting work during which intermittent and impact loads are exerted on a cutting edge.

Contrary to this, it is apparent that the comparative coated tools 1 to 9, 11 to 19, 21 to 24, and the reference coated tools 10, 20, and 25 generates high-temperature heat and generates chipping, defects, and the like in a case of being used for high-speed intermittent cutting work during which intermittent and impact loads are exerted on a cutting edge, resulting in the end of the service life within a short period of time.

INDUSTRIAL APPLICABILITY

As described above, the coated tool of the present invention can be used as a coated tool for various work materials as well as for high-speed intermittent cutting work of alloy steel and further exhibits excellent chipping resistance and wear resistance during long-term use, thereby sufficiently satisfying an improvement in performance of a cutting device, power saving and energy saving during cutting work, and a further reduction in costs.

The invention claimed is:

1. A surface-coated cutting tool comprises:
   a tool body that is made of any of tungsten carbide-based cemented carbide, titanium carbonitride-based cermet, and a cubic boron nitride-based ultrahigh-pressure sintered body; and
   a hard coating layer that is provided on a surface of the tool body, wherein
   (a) the hard coating layer includes at least a layer of a complex nitride or complex carbonitride of Ti and Al, the layer being formed to an average layer thickness of 1 μm to 20 μm in a chemical vapor deposition method, and in a case where the layer is expressed by the composition formula: $(Ti_{1-x}Al_x)(C_yN_{1-y})$, where x is an amount (atomic ratio) of Al in a total amount of Ti and Al, y is an amount (atomic ratio) of C in a total amount of C and N, and Xavg is an average of x which satisfies 0.60≤Xavg≤0.95 and Yavg is an average of y which satisfies 0≤Yavg≤0.005, (b) the layer of a complex nitride or complex carbonitride includes at least a phase of a complex nitride or complex carbonitride having an NaCl type face-centered cubic structure, (c) regarding the layer of a complex nitride or complex carbonitride, in a case where crystal orientations of individual crystal grains having an NaCl type face-centered cubic structure in the layer of a complex nitride or complex carbonitride in a longitudinal sectional direction of the layer of a complex nitride or complex carbonitride are analyzed using an electron backscatter diffraction apparatus, when an inclined angle frequency distribution is obtained by measuring inclined angles of normal lines of $\{111\}$ planes which are crystal planes of the crystal grains with respect to a normal direction of the surface of the tool body, dividing inclined angles in a range of 0 degrees to 45 degrees with respect to the normal direction among the measured inclined angles into intervals of 0.25 degrees, and aggregating frequencies in the respective divisions, a highest peak is present in an inclined angle division in a range of 0 degrees to 10 degrees, and a sum of frequencies that are present in the range of 0 degrees to 10 degrees has a proportion of 45% or higher of a total of the frequencies in the inclined angle frequency distribution, (d) regarding the layer of a complex nitride or complex carbonitride, in a case where the layer is observed in the longitudinal sectional direction, a columnar structure in which an average grain width W of the individual crystal grains having an NaCl type face-centered cubic structure in the layer of a complex nitride or complex carbonitride is 0.1 μm to 2.0 μm and an average aspect ratio A thereof is 2 to 10 is included, and (e) in the individual crystal grains having an NaCl type face-centered cubic structure in the layer of a complex nitride or complex carbonitride, a periodic compositional variation of x in Ti and Al in the $(Ti_{1-x}Al_x)(C_yN_{1-y})$ is present along one orientation among equivalent crystal orientations expressed by <001> of the crystal grains, x varies periodically and a difference Δx between an average of maximum values of x and an average of minimum values of x is 0.03 to 0.25.

2. The surface-coated cutting tool according to claim 1, wherein,
in the crystal grains having an NaCl type face-centered cubic structure in which the periodic compositional variation in Ti and Al is present in the layer of a complex nitride or complex carbonitride, the periodic compositional variation in Ti and Al is present along one orientation among the equivalent crystal orientations expressed by <001> of the crystal grains,
a period along the orientation is 3 nm to 100 nm, and
a compositional variation of Al in a plane perpendicular to the orientation in a total amount of Ti and Al is 0.01 or less.

3. The surface-coated cutting tool according to claim 1, wherein,
regarding the layer of a complex nitride or complex carbonitride, lattice constants a of the crystal grains having an NaCl type face-centered cubic structure are obtained from X-ray diffraction, and
the lattice constants a of the crystal grains having an NaCl type face-centered cubic structure satisfy a relationship of $0.05a_{TiN}+0.95a_{AlN} \leq a \leq 0.4a_{TiN}+0.6a_{AlN}$ for a lattice constant $a_{TiN}$ of cubic TiN and a lattice constant $a_{AlN}$ of cubic AlN.

4. The surface-coated cutting tool according to claim 1, wherein the layer of a complex nitride or complex carbonitride is formed of a single phase of a complex nitride or complex carbonitride of Ti and Al having an NaCl type face-centered cubic structure.

5. The surface-coated cutting tool according to claim 1, wherein,
regarding the layer of a complex nitride or complex carbonitride, in a case where the layer is observed in the longitudinal sectional direction, in grain boundaries of the columnar structure constituted by the individual crystal grains having an NaCl type face-centered cubic structure in the layer of a complex nitride or complex carbonitride, fine crystal grains having a hexagonal structure are present,
an area proportion of the fine crystal grains present is 30% or lower by area, and
an average grain size R of the fine crystal grains is 0.01 μm to 0.3 μm.

6. The surface-coated cutting tool according to claim 1, wherein,
a lower layer is provided between the tool body and the layer of a complex nitride or complex carbonitride of Ti and Al, said lower layer being formed of a Ti compound layer that includes one layer or two or more layers of a Ti carbide layer, a Ti nitride layer, a Ti carbonitride layer, a Ti oxycarbide layer, and
a Ti oxycarbonitride layer and has an average total layer thickness of 0.1 μm to 20 μm is present.

7. The surface-coated cutting tool according to claim 1, wherein an upper layer which includes an aluminum oxide layer having an average layer thickness of at least 1 μm to 25 μm is present in an upper portion of the layer of a complex nitride or complex carbonitride.

8. The surface-coated cutting tool according to claim 1, wherein the layer of a complex nitride or complex carbonitride is formed by a chemical vapor deposition method in which at least trimethylaluminum is contained as a reaction gas component.

9. The surface-coated cutting tool according to claim 8, wherein a composition of the reaction gas varies periodically on the surface of the tool body.

10. The surface-coated cutting tool according to claim 8, wherein the reaction gas comprises at least two different gas groups, which are supplied to a reaction apparatus from separate gas supply tubes.

* * * * *